(12) United States Patent
Chang et al.

(10) Patent No.: US 10,489,548 B2
(45) Date of Patent: Nov. 26, 2019

(54) INTEGRATED CIRCUIT AND METHOD FOR MANUFACTURING THE SAME

(71) Applicant: TAIWAN SEMICONDUCTOR MANUFACTURING COMPANY, LTD., Hsinchu (TW)

(72) Inventors: Yu-Jung Chang, Zhubei (TW); Chin-Chang Hsu, Banqiao (TW); Hsien-Hsin Sean Lee, Duluth, GA (US); Wen-Ju Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/861,128

(22) Filed: Jan. 3, 2018

(65) Prior Publication Data

US 2018/0341735 A1 Nov. 29, 2018

Related U.S. Application Data

(60) Provisional application No. 62/511,847, filed on May 26, 2017.

(51) Int. Cl.
*G06F 17/50* (2006.01)
*H01L 27/118* (2006.01)
(Continued)

(52) U.S. Cl.
CPC .... *G06F 17/5072* (2013.01); *H01L 21/28008* (2013.01); *H01L 21/823431* (2013.01);
(Continued)

(58) Field of Classification Search
CPC ................. G06F 17/5072; H01L 29/78; H01L 21/823437; H01L 21/28008; H01L 21/823431; H01L 27/0886; H01L 27/0207
See application file for complete search history.

(56) References Cited

U.S. PATENT DOCUMENTS

2016/0147926 A1 5/2016 Chiang et al.
2017/0033101 A1* 2/2017 Sharma ............... H01L 29/6681
2017/0287909 A1* 10/2017 Oh ....................... G06F 17/5072

FOREIGN PATENT DOCUMENTS

KR 10-2016-0063236 6/2016
KR 10-2017-0014349 2/2017
(Continued)

OTHER PUBLICATIONS

Office Action dated Nov. 28, 2018 from corresponding application No. TW 107105716.
(Continued)

*Primary Examiner* — Sonya D. McCall-Shepard
(74) *Attorney, Agent, or Firm* — Hauptman Ham, LLP

(57) ABSTRACT

An integrated circuit includes a first and second set of gate structures. A center of each of the first set of gate structures is separated from a center of an adjacent gate of the first set of gate structures in a first direction by a first pitch. A center of each of the second set of gate structures is separated from a center of an adjacent gate of the second set of gate structures in the first direction by the first pitch. The first and second set of gate structures extend in a second direction. A gate of the first set of gate structures is aligned in the second direction with a corresponding gate of the second set of gate structures. The gate of the first set of gate structures is separated from the corresponding gate of second set of gate structures in the second direction by a first distance.

20 Claims, 10 Drawing Sheets

(51) Int. Cl.
  *H01L 21/8234* (2006.01)
  *H01L 29/49* (2006.01)
  *H01L 27/088* (2006.01)
  *H01L 21/28* (2006.01)
  *H01L 27/02* (2006.01)
  *H01L 29/40* (2006.01)

(52) U.S. Cl.
  CPC .. *H01L 21/823437* (2013.01); *H01L 27/0886* (2013.01); *H01L 27/11807* (2013.01); *H01L 29/401* (2013.01); *H01L 29/4916* (2013.01); *H01L 27/0207* (2013.01); *H01L 27/088* (2013.01)

(56) References Cited

FOREIGN PATENT DOCUMENTS

| | | |
|---|---|---|
| TW | 201123419 | 7/2011 |
| TW | 201539543 | 10/2015 |
| TW | 201642469 | 12/2016 |
| TW | 201701413 | 1/2017 |
| TW | I580040 | 4/2017 |

OTHER PUBLICATIONS

Office Action dated Jul. 20, 2019 from corresponding application No. KR 10-2018-0059040.

* cited by examiner

INTEGRATED CIRCUIT AND METHOD FOR MANUFACTURING THE SAME

PRIORITY CLAIM AND CROSS-REFERENCE

This application claims the benefit of U.S. Provisional Application No. 62/511,847, filed May 26, 2017, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
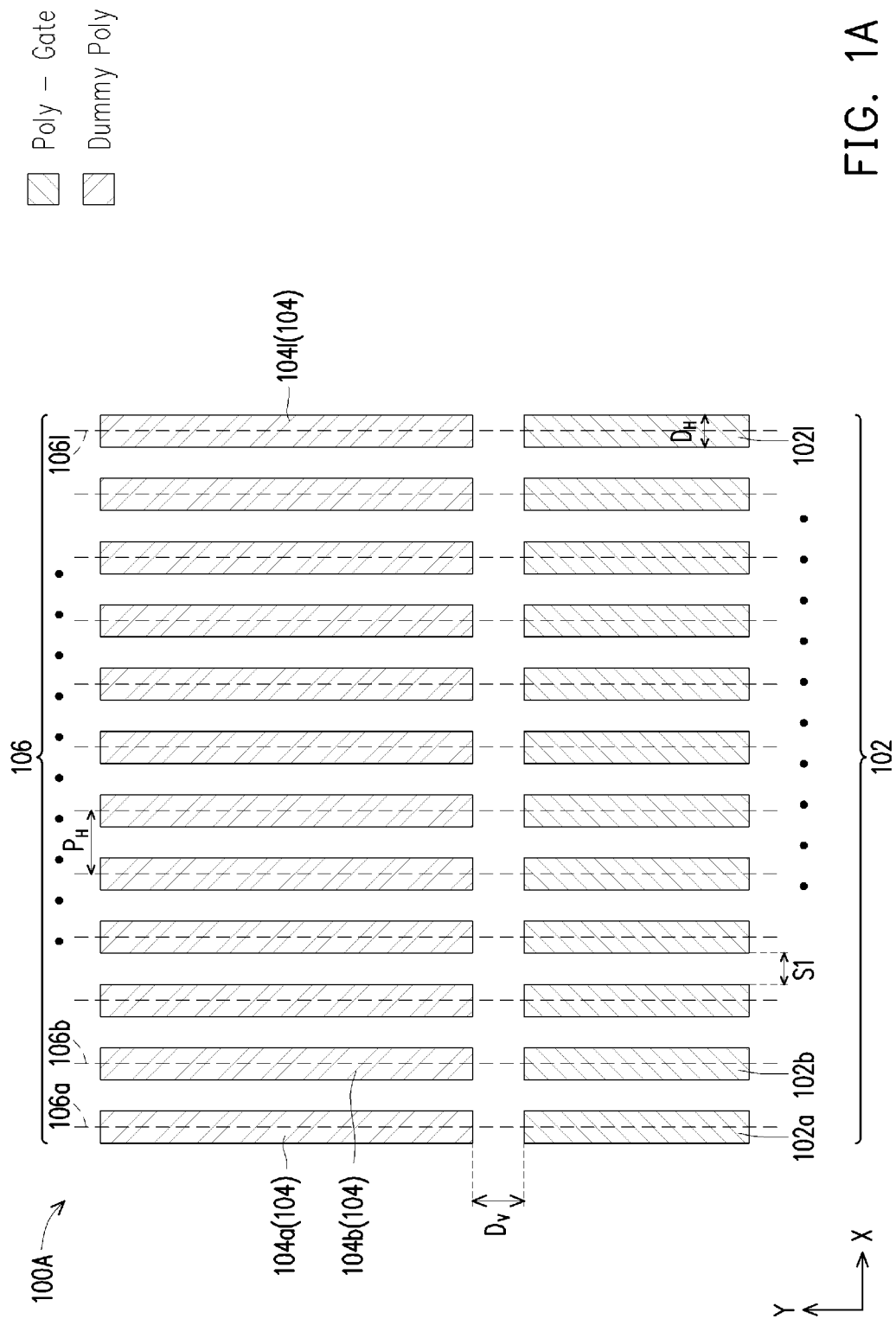
FIG. 1A is a top view of a portion of an IC, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of forming an integrated circuit includes generating, by a processor, a layout design of the integrated circuit, the integrated circuit having at least a gate structure of a set of gate structures. In some embodiments, generating the layout design comprises generating a set of gate layout patterns corresponding to fabricating a set of gate structures of the integrated circuit. The method further includes generating a cut feature layout pattern, manufacturing the integrated circuit based on the layout design, and removing a first portion of the gate structure of the set of gate structures to form a first gate structure and a second gate structure. In some embodiments, the cut feature layout pattern identifies a location of the first portion of the gate structure of the set of gate structures.

In some embodiments, the set of gate layout patterns includes a first set of gate layout patterns and a second set of gate layout patterns. In some embodiments, the first set of gate layout patterns corresponds to fabricating a set of functional gate structures of the integrated circuit. In some embodiments, the second set of gate layout patterns corresponds to fabricating a set of non-functional gate structures of the integrated circuit. In some embodiments, non-functional gate structures correspond to dummy gate structures.

In some embodiments, the cut feature layout pattern extends in a first direction and overlaps the set of gate layout patterns. In some embodiments, each of the layout patterns of the set of gate layout patterns is separated from an adjacent layout pattern of the set of gate layout patterns in the first direction by a first pitch.

In some embodiments, the set of gate layout patterns extends in a second direction different from the first direction and overlapping a set of gridlines. In some embodiments, the set of gridlines extends in the second direction. In some embodiments, each gridline of the set of gridlines is separated from an adjacent gridline of the set of gridlines by the first pitch.

One or more embodiments include an integrated circuit and a corresponding layout design of the integrated circuit with better performance than other approaches. In some embodiments, gates and dummy gates of the integrated circuit are placed closer together than other approaches resulting in a smaller area of the integrated circuit of the present disclosure than other approaches. In some embodiments, the first set of gate layout patterns and the second set of gate layout patterns of the present disclosure are placed closer together than other approaches resulting in a smaller area of the layout design of the integrated circuit than other approaches. In some embodiments, by placing the first set of gate layout patterns and the second set of gate layout patterns closer together than other approaches results in a layout design with more uniform gate pattern density causing less dishing from chemical mechanical planarization (CMP) processes than other approaches. In some embodiments, by placing the gates and dummy gates closer together results in an integrated circuit with a more uniform gate pattern density causing less dishing from CMP processes than other approaches. In some embodiments, the method of manufacturing the integrated circuit of the present disclosure has more regular gate layout patterns yielding greater process control (e.g., etching) than other approaches. In some embodiments, a regular layout pattern is a layout pattern aligned with another layout pattern in at least one direction (e.g., first direction or second direction). In some embodiments, by placing the gates and dummy gates closer together results in an integrated circuit with more uniform gate pattern density causing less polysilicon stitching than other approaches. In some embodiments, by placing the first set of gate layout patterns and the second set of gate layout patterns closer together results in a layout design with more uniform gate pattern density and less polysilicon stitching than other approaches.

FIG. 1A is a top view of a portion of an IC 100A, in accordance with some embodiments.

Figure 6:
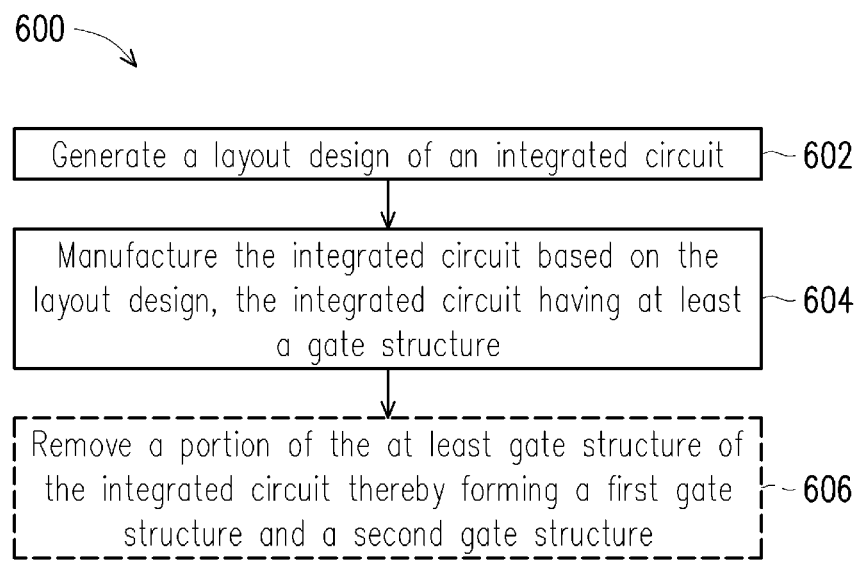
FIG. 6 is a flowchart of a method of manufacturing an IC, in accordance with some embodiments.

IC 100A includes a first set of gate structures 102 and a second set of gate structures 104. The first set of gate structures 102 is separated from the second set of gate structures 104 by a cut distance $D_V$. In some embodiments, the first set of gate structures 102 corresponds to one or more gates of functional transistor devices. In some embodiments, the second set of gate structures 104 corresponds to one or more gates of non-functional transistor devices. In some embodiments, non-functional transistor devices are referred to as dummy transistor devices. In some embodiments, the second set of gates 104 are referred to as dummy gates. In some embodiments, IC 100A corresponds to an integrated circuit after operation 606 in method 600 (FIG. 6).

The first set of gate structures 102 includes one or more of gate structures 102a, 102b, . . . , 102l. A side of each gate structure 102a, 102b, . . . , 102l of the first set of gate structures 102 is separated from a side of an adjacent gate structure of the first set of gate structures 102 in a first direction X by a distance S1. Each gate structure 102a, 102b, . . . , 102l of the first set of gate structures 102 extends in a second direction Y different from the first direction X. In some embodiments, the second direction Y is orthogonal to the first direction X. Each gate structure 102a, 102b, . . . , 102l of the first set of gate structures 102 overlaps a corresponding gridline 106a, 106b, . . . , 106l (collectively referred to as "gridlines 106"). Other configurations or quantities of gate structures in the first set of gate structures 102, gate structures in the second set of gate structures 104 or gridlines 106 are within the contemplated scope of the present disclosure.

Gridlines 106 are arranged in second direction Y. Each gridline of gridlines 106 is separated from an adjacent gridline of gridlines 106 by a pitch $P_H$. In some embodiments, gridlines 106 define regions where gate structures in the first set of gate structures 102 or in the second set of gate structures 104 are positioned.

The second set of gate structures 104 includes one or more of gate structures 104a, 104b, . . . , 104l. A side of each gate structure 104a, 104b, . . . , 104l of the second set of gate structures 104 is separated from a side of an adjacent gate structure of the second set of gate structures 104 in the first direction X by the distance S1. Each gate structure 104a, 104b, . . . , 104l of the second set of gate structures 104 extends in a second direction Y. Each gate structure 104a, 104b, . . . , 104l of the second set of gate structures 104 overlaps a corresponding gridline 106a, 106b, . . . , 106l.

In some embodiments, each gate structure 104a, 104b, . . . , 104l of the second set of gate structures 104 is aligned with a corresponding gate structure 102a, 102b, . . . , 102l of the first set of gate structures 102.

In some embodiments, an edge of gate structure 104a, 104b, . . . , 104l of the second set of gate structures 104 is aligned in the second direction Y with an edge of a corresponding gate structure 102a, 102b, . . . , 102l of the first set of gate structures 102.

In some embodiments, a longitudinal center of gate structure 104a, 104b, . . . , 104l of the second set of gate structures 104 is aligned in the second direction Y with a longitudinal center of a corresponding gate structure 102a, 102b, . . . , 102l of the first set of gate structures 102.

In some embodiments, a gridline 106a, 106b, . . . , 106l is aligned in the second direction Y with a center of a corresponding gate structure 104a, 104b, . . . , 104l of the second set of gate structures 104 or a center of a corresponding gate structure 102a, 102b, . . . , 102l of the first set of gate structures 102. In some embodiments, a gridline 106a, 106b, . . . , 106l is aligned in the second direction Y with a side of a corresponding gate structure 104a, 104b, . . . , 104l of the second set of gate structures 104 or a side of a corresponding gate structure 102a, 102b, . . . , 102l of the first set of gate structures 102.

In some embodiments, a gridline 106a, 106b, . . . , 106l is offset in the first direction X with a center of a corresponding gate structure 104a, 104b, . . . , 104l of the second set of gate structures 104 by a same distance (not shown) as being offset from a center of a corresponding gate structure 102a, 102b, . . . , 102l of the first set of gate structures 102.

In some embodiments, each gate structure 104a, 104b, . . . , 104l of the second set of gate structures 104 is separated from a corresponding gate structure 102a, 102b, . . . , 102l of the first set of gate structures 102 by cut distance $D_V$. In some embodiments, the cut distance $D_V$ ranges from about 0.01 am to about 0.06 am.

In some embodiments, at least one gate structure 104a, 104b, . . . , 104l of the second set of gate structures 104 or at least one gate structure 102a, 102b, . . . , 102l of the first set of gate structures 102 has a width $D_H$ in the first direction X.

In some embodiments, at least one gate structure 104a, 104b, . . . , 104l of the second set of gate structures 104 or at least one gate structure 102a, 102b, . . . , 102l of the first set of gate structures 102 comprises polysilicon, or the like.

In some embodiments, IC 100A, 100B (FIG. 1B) or 400 (FIG. 4) corresponds to one or more standard cells. In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM), read only memory (ROM), or the like. In some embodiments, a standard cell includes one or more active or passive elements. Examples of active elements include, but are not limited to, transistors, diodes, or the like. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors or the like. In some embodiments, IC 100A includes other features not shown for ease of illustration.

In some embodiments, a distance between gate structures in the first set of gate structures 102 and gate structures in the second set of gate structures 104 is smaller than other approaches. In some embodiments, by placing gate structures in the first set of gate structures 102 and gate structures in the second set of gate structures 104 closer together than other approaches, results in a smaller area of IC 100A, 100B or 400 than other approaches. In some embodiments, by placing gate structures in the first set of gate structures 102 and gate structures in the second set of gate structures 104 closer together than other approaches, IC 100A, 100B or 400 has a more uniform gate pattern density than other approaches causing less dishing from CMP processes than other approaches. In some embodiments, by placing gate structures in the first set of gate structures 102 and gate structures in the second set of gate structures 104 closer together than other approaches, IC 100A, 100B or 400 has a more uniform gate pattern density than other approaches causing less polysilicon stitching than other approaches.

Figure 1B:
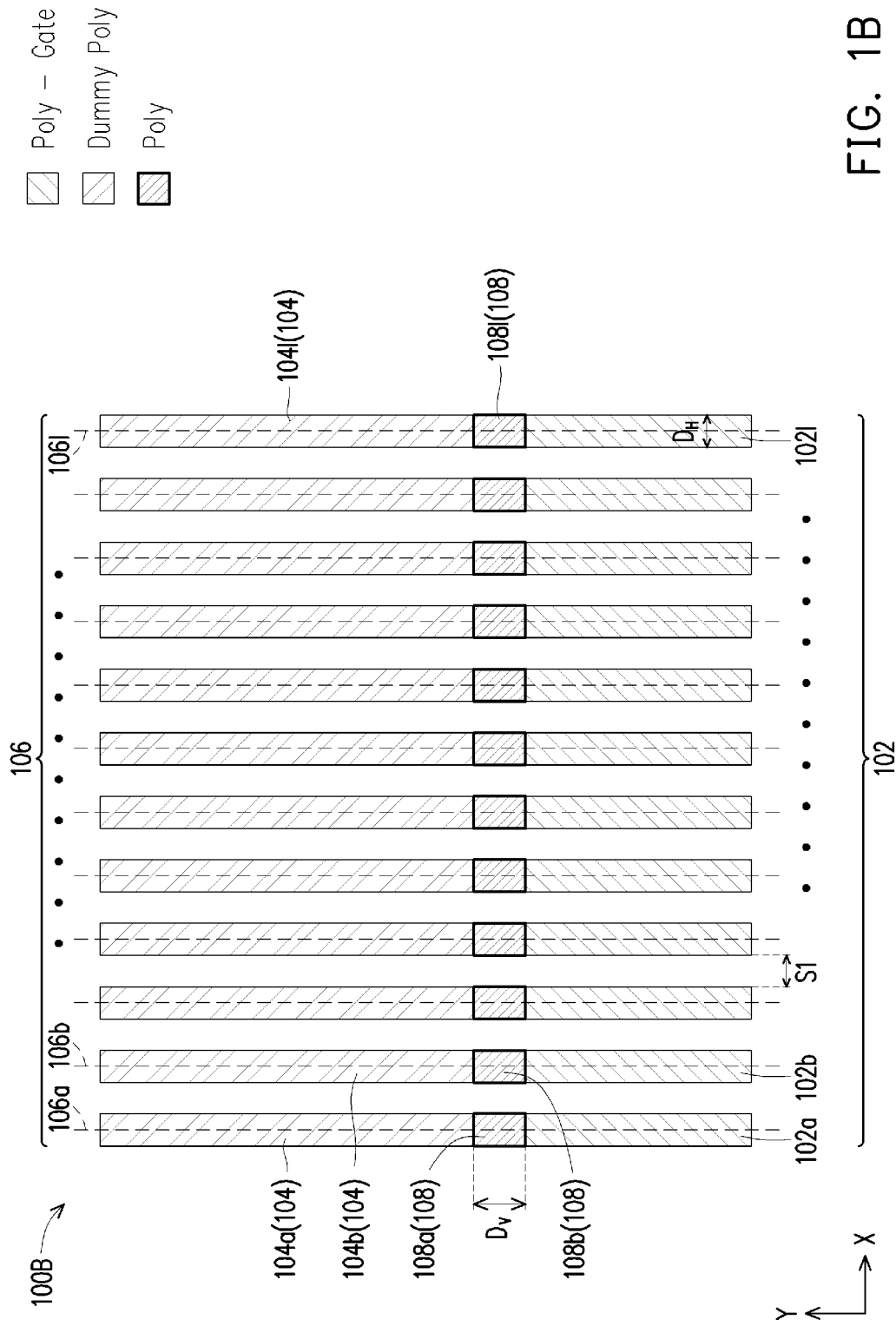
FIG. 1B is a top view of a portion of an IC, in accordance with some embodiments.

FIG. 1B is a top view of a portion of an IC 100B, in accordance with some embodiments. IC 100B is a variation of IC 100A (FIG. 1A). In comparison with IC 100A of FIG. 1A, IC 100B further includes a set of gate structures 108 between the first set of gate structures 102 and the second set of gate structures 104. The set of gate structures 108 couple the first set of gate structures 102 to the second set of gate structures 104. In some embodiments, the first set of gate structures 102, second set of gate structures 104 and set of gate structures 108 are integrally formed. In some embodiments, IC 100B corresponds to an integrated circuit after operation 604 in method 600 (FIG. 6).

The set of gates structures 108 includes one or more of gate structures 108a, 108b, . . . , 108l. A side of each gate structure 108a, 108b, . . . , 108l of the set of gate structures 108 is separated from a side of an adjacent gate structure of the set of gate structures 108 in the first direction X by distance S1. Each gate structure 108a, 108b, . . . , 108l of the set of gate structures 108 extends in the second direction Y. Each gate structure 108a, 108b, . . . , 108l of the set of gate structures 108 overlaps a corresponding gridline 106a, 106b, . . . , 106l.

In some embodiments, at least one gate structure 108a, 108b, . . . , 108l of the set of gate structures 108 has width $D_H$ in the first direction X. In some embodiments, each gate structure 108a, 108b, . . . , 108l of the set of gate structures 108 has a length in the second direction equal to cut distance $D_V$.

In some embodiments, each gate structure 108a, 108b, . . . , 108l of the set of gate structures 108 is aligned with a corresponding gate structure 104a, 104b, . . . , 104l of the second set of gate structures 104 or a corresponding gate structure 102a, 102b, . . . , 102l of the first set of gate structures 102.

In some embodiments, an edge of gate structure 108a, 108b, . . . , 108l of the set of gate structures 108 is aligned in the second direction Y with an edge of a corresponding gate structure 102a, 102b, . . . , 102l of the first set of gate structures 102 or an edge of gate structure 104a, 104b, . . . , 104l of the second set of gate structures 104.

In some embodiments, a center of gate structure 104a, 104b, . . . , 104l of the second set of gate structures 104 is aligned in the second direction Y with a center of a corresponding gate structure 102a, 102b, . . . , 102l of the first set of gate structures 102.

In some embodiments, a gridline 106a, 106b, . . . , 106l is aligned in the second direction Y with a center of a corresponding gate structure 108a, 108b, . . . , 108l of the set of gate structures 108. In some embodiments, a gridline 106a, 106b, . . . , 106l is aligned in the second direction Y with a side of a corresponding gate structure 108a, 108b, . . . , 108l of the set of gate structures 108.

In some embodiments, at least one gate structure of the set of gate structures 108 comprises polysilicon, or the like.

Figure 2:
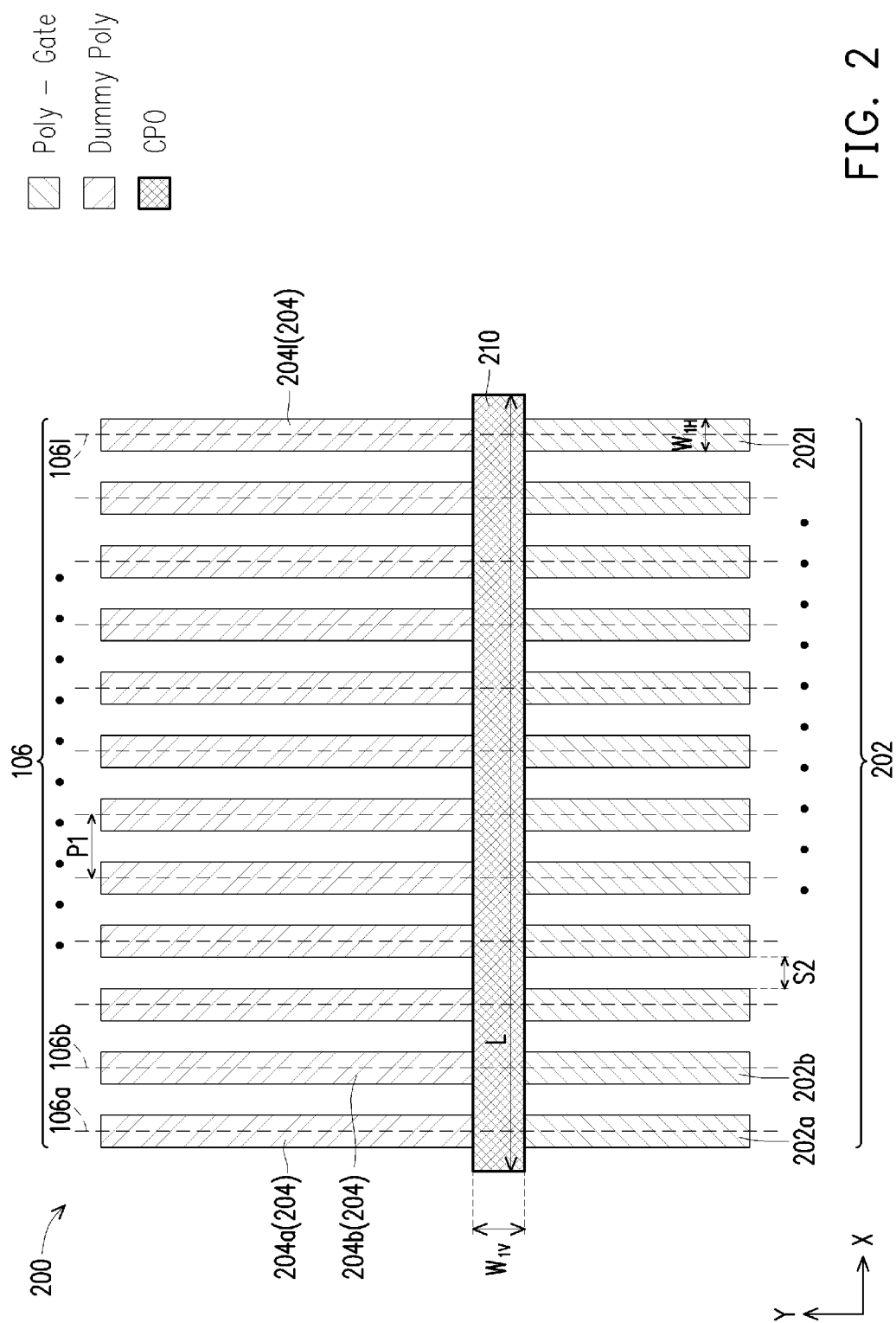
FIG. 2 is a diagram of a layout design of an IC, in accordance with some embodiments.

FIG. 2 is a diagram of a layout design 200 of an IC, in accordance with some embodiments.

Layout design 200 is usable to manufacture IC 100A (FIG. 1A) or 100B (FIG. 1B). Components that are the same or similar to those in each of FIG. 1A-1B or 2-5 are given the same reference numbers, and detailed description thereof is thus omitted.

Structural relationships including alignment, lengths and widths, as well as configurations of layout design 200, layout design 300 (FIG. 3), layout design 500 (FIG. 5) are similar to the structural relationships and configurations of IC 100A-100B of FIG. 1A-1B or IC 400 of FIG. 400, and will not be described for brevity.

Figure 3:
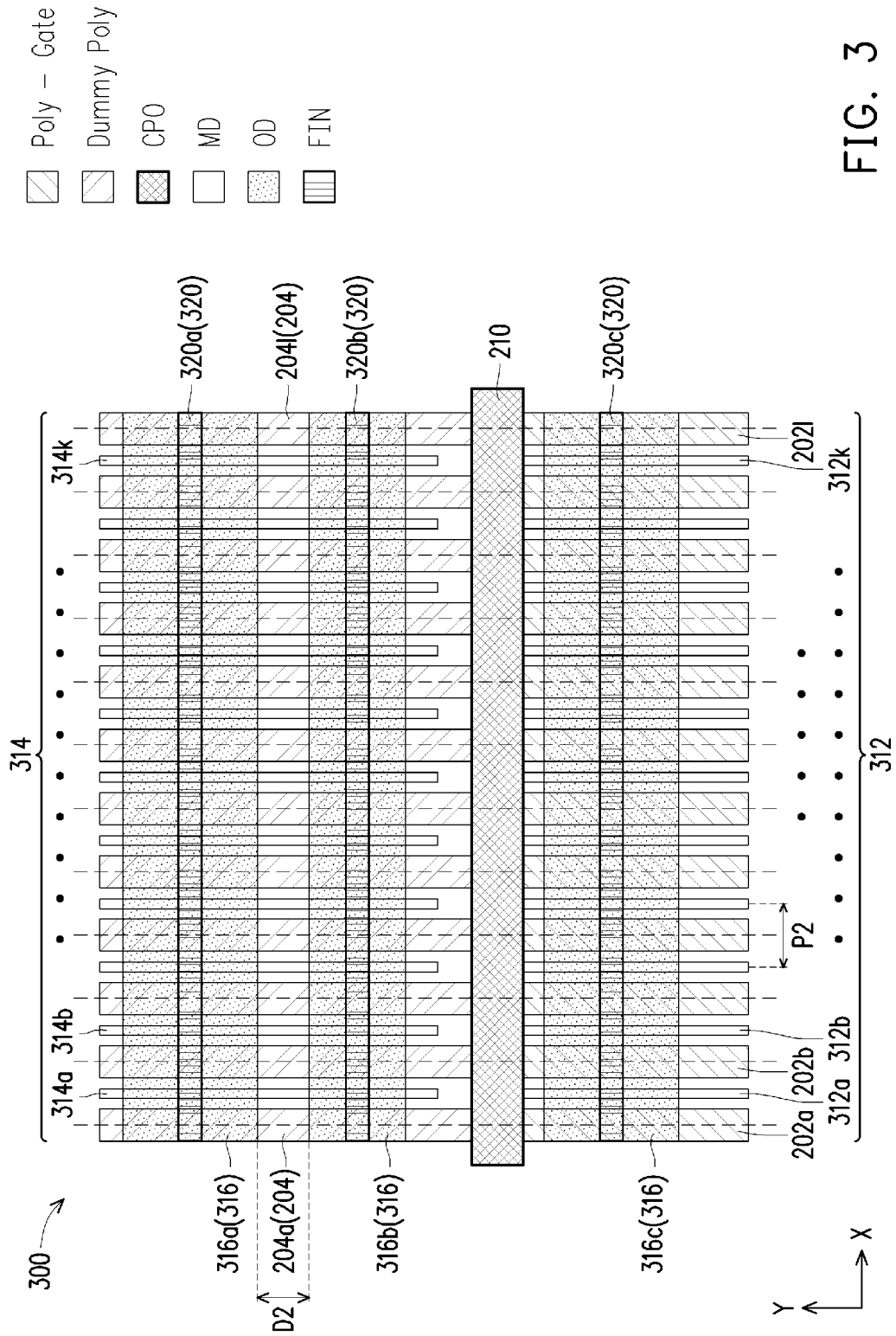
FIG. 3 is a diagram of a layout design of an IC, in accordance with some embodiments.

Layout design 200 includes a first set of gate layout patterns 202, a second set of gate layout patterns 204, and a poly cut feature layout pattern 210. The first set of gate layout patterns 202 is usable to manufacture a corresponding first set of gate structures 102 (FIGS. 1A-1B) of IC 100A-100B. The second set of gate layout patterns 204 is usable to manufacture a corresponding second set of gate structures 104 (FIGS. 1A-1B) of IC 100A-100B. In some embodiments, the portion of the gate structure 108 that is removed in operation 606 of method 600 (FIG. 6) is identified in layout designs 200 and 300 by poly cut feature layout pattern 210 (FIGS. 2-3).

The first set of gate layout patterns 202 and second set of gate layout patterns 204 extend in the second direction Y and overlap the set of gridlines 106. The first set of gate layout patterns 202 and second set of gate layout patterns 204 are separated from each other in the second direction Y by a distance corresponding to a pattern width $W_{1Y}$ in the second direction Y.

The first set of gate layout patterns 202 includes one or more of gate layout patterns 202a, 202b, . . . , 202l. In some embodiments, a center of each layout pattern of the first set of gate layout patterns 202 is separated from a center of an adjacent layout pattern of the first set of gate layout patterns 202 in the first direction X by a pitch Pb. In some embodiments, a side of each layout pattern of the first set of gate layout patterns 202 is separated from a side of an adjacent layout pattern of the first set of gate layout patterns 202 in the first direction X by a distance S2. Each layout pattern of the first set of gate layout patterns 202 extends in the second direction Y and overlaps set of gridlines 106.

In some embodiments, each gridline of the set of gridlines 106 is separated from an adjacent gridline of the set of gridlines 106 by pitch P1.

The second set of gate layout patterns 204 includes one or more of gate layout patterns 204a, 204b, . . . 204l. In some embodiments, a center of each layout pattern of the second set of gate layout patterns 204 is separated from a center of an adjacent layout pattern of the second set of gate layout patterns 204 in the first direction X by pitch P1. In some embodiments, a side of each layout pattern of the second set of gate layout patterns 204 is separated from a side of an adjacent layout pattern of the second set of gate layout patterns 204 in the first direction X by a distance S2. Each layout pattern of the second set of gate layout patterns 204 extends in the second direction Y and overlaps set of gridlines 106.

In some embodiments, each layout pattern 202a, 202b, ..., 202l of the first set of gate layout patterns 202 is aligned with a corresponding gate layout pattern 204a, 204b, ..., 204l of the second set of gate layout patterns 204.

In some embodiments, an edge of gate layout pattern 202a, 202b, ..., 202l of the first set of gate layout patterns 202 is aligned in the second direction Y with an edge of a corresponding gate layout pattern 204a, 204b, ..., 204l of the second set of gate layout patterns 204.

In some embodiments, a center of gate layout pattern 202a, 202b, ..., 202l of the first set of gate layout patterns 202 is aligned in the second direction Y with a center of a corresponding gate layout pattern 204a, 204b, ..., 204l of the second set of gate layout patterns 204.

In some embodiments, a gridline 106a, 106b, ..., 106l is aligned in the second direction Y with a center of a corresponding gate layout pattern 204a, 204b, ..., 204l of the second set of gate layout patterns 204 or a center of a corresponding gate layout pattern 202a, 202b, ..., 202l of the first set of gate layout patterns 202. In some embodiments, a gridline 106a, 106b, ..., 106l is aligned in the second direction Y with a side of a corresponding gate layout pattern 204a, 204b, ..., 204l of the second set of gate layout patterns 204 or a side of a corresponding gate layout pattern 202a, 202b, ..., 202l of the first set of gate layout patterns 202. In some embodiments, a gridline 106a, 106b, ..., 106l is offset in the first direction X with a center of a corresponding gate layout pattern 204a, 204b, ..., 204l of the second set of gate layout patterns 204 by a same distance (not shown) as being offset from a center of a corresponding gate layout pattern 202a, 202b, ..., 202l of the first set of gate layout patterns 202. In some embodiments, each gate layout pattern 204a, 204b, ..., 204l of the second set of gate layout patterns 204 contacts a corresponding gate layout pattern 202a, 202b, ..., 202l of the first set of gate layout patterns 202.

In some embodiments, each gate layout pattern 202a, 202b, ..., 202l of the first set of gate layout patterns 202 or each gate layout pattern 204a, 204b, ..., 204l of the second set of gate layout patterns 204 has a corresponding pattern width $W_{1H}$ in the first direction X. Other configurations or quantities of patterns in the first set of gate layout patterns 202 or the second set of gate layout patterns 204 are within the scope of the present disclosure.

Poly cut feature layout pattern 210 extends in the first direction X. Poly cut feature layout pattern 210 has a pattern width $W_{1V}$ in the second direction Y, and a pattern length L in the first direction X. In some embodiments, the poly cut feature layout pattern 210 is usable to identify a location of at least a portion of gate structure 108 of IC 100B that is removed during operation 606 of method 600 (FIG. 6).

In some embodiments, the pattern width $W_{1V}$ corresponds to the cut width $D_V$ of one or more of gate structure 102a, 102b, ..., 102l or gate structure 104a, 104b, ..., 104l.

In some embodiments, the pattern width $W_{1H}$ of each gate layout pattern 202a, 202b, ..., 202l corresponds to the cut width $D_H$ of each corresponding gate structure 102a, 102b, ..., 102l. In some embodiments, the pattern width $W_{1H}$ of each gate layout pattern 204a, 204b, ..., 204l corresponds to the cut width $D_H$ of each corresponding gate structure 104a, 104b, ..., 104l.

In some embodiments, the pattern length L is greater than a sum of the pattern width $W_{1H}$ of each gate layout pattern 202a, 202b, ..., 202l in the first of gate layout patterns 202 or gate layout pattern 204a, 204b, ..., 204l in the second of gate layout patterns 204.

In some embodiments, the first set of gate layout patterns 202, the second set of gate layout patterns 204, and the poly cut feature layout pattern 210 are located on a poly-gate layout level (POLY). Other configurations or quantities of patterns in the poly cut feature layout pattern 210 are within the scope of the present disclosure.

In some embodiments, a distance between layout patterns in the first set of gate layout patterns 202 and layout patterns in the second set of gate layout patterns 204 is smaller than other approaches, causing an area of layout design 200-300 or 500 to be smaller than other approaches. In some embodiments, by placing the first set of gate layout patterns 202 and the second set of gate layout patterns 204 closer together than other approaches results in a layout design 200-300 or 500 with more uniform gate pattern density causing less dishing from chemical mechanical planarization (CMP) processes than other approaches. In some embodiments, by placing the first set of gate layout patterns 202 and the second set of gate layout patterns 204 closer together than other approaches results in a layout design 200-300 or 500 with more uniform gate pattern density causing less poly-silicon stitching than other approaches.

FIG. 3 is a diagram of a layout design 300 of an IC, in accordance with some embodiments. Layout design 300 is usable to manufacture IC 100A (FIG. 1A) or 100B (FIG. 1B).

Layout design 300 is a variation of layout design 200 (FIG. 2). In comparison with layout design 200 of FIG. 2, layout design 300 further includes one or more active region layout patterns 316a, 316b, 316c (collectively referred to as "set of active region layout patterns 316") each extending in the first direction X, and having a length L2 (not shown) in the second direction Y. The set of active region layout patterns 316 is below the first set of gate layout patterns 202 and the second set of gate layout patterns 204. Set of active region layout patterns 316 is usable to manufacture a corresponding set of active regions (not shown) of IC 100A, 100B. In some embodiments, set of active regions (not shown) of IC 100A, 100B, 400 is referred to as an oxide-definition (OD) region of IC 100A, 100B, 400 which defines the source or drain diffusion regions of IC 100A, 100B, 400. In some embodiments, one or more active region layout patterns (not shown) of layout design 200, 300 or 500 is referred to as one or more OD layout patterns of layout design 200, 300 or 500 which defines the source or drain diffusion layout patterns of layout design 200, 300 or 500. Each layout pattern 316a, 316b, 316c of the set of active region layout patterns 316 is separated from each other in the second direction Y.

Active region layout pattern 316a is separated from active region layout pattern 316b by a distance D2. In some embodiments, active region layout pattern 316a and active region layout pattern 316b are part of the same active region layout pattern. In some embodiments, active region layout pattern 316c includes two or more discontinuous active region layout patterns. In some embodiments, active region layout pattern 316a, 316b, and 316c are part of a same, continuous active region layout pattern. Other configurations or quantities of patterns in the set of active region layout patterns 316 are within the scope of the present disclosure.

Layout design 300 further includes one or more fin layout patterns 320a, 320b, 320c (collectively referred to as "set of fin layout patterns 320") each extending in the first direction X. Fin layout patterns 320a, 320b, 320c are over corresponding active region layout pattern 316a, 316b, 316c. The set of fin layout patterns 320 are below the first set of gate layout patterns 202 and the second set of gate layout patterns 204. Each of the layout patterns of the set of fin layout patterns 320 is separated from an adjacent layout pattern of the set of fin layout patterns 320 in the second direction Y by a fin pitch (not shown). The set of fin layout patterns 320 is usable to manufacture a corresponding set of fins (not shown) of IC 100A-100B. Other configurations or quantities of fins in the set of fin layout patterns 320 are within the scope of the present disclosure.

Layout design 300 further includes one or more conductive feature layout patterns 312a, 312b, . . . , 312k (collectively referred to as a "set of conductive feature layout patterns 312") each extending in the second direction Y. The set of conductive feature layout patterns 312 is above the set of active region layout patterns 316. In some embodiments, set of conductive feature layout patterns 312 corresponds to a first set of metal diffusion (MD) layout patterns. Set of conductive feature layout patterns 312 is usable to manufacture a corresponding first set of MD conductive features (not shown) on the metal-zero (M0) layer of IC 100A, 100B. In some embodiments, the first set of MD conductive features (not shown) of IC 100A, 100B are connected to source or drain diffusion regions of IC 100A, 100B.

Each layout pattern 312a, 312b, . . . , 312k of the set of conductive feature layout patterns 312 extends in the second direction Y, and is separated from each other in the first direction X. In some embodiments, a center of each layout pattern of the set of conductive feature layout patterns 312 is separated from a center of an adjacent layout pattern of the set of conductive feature layout patterns 312 in the first direction X by a pitch P2. Each layout pattern of the set of conductive feature layout patterns 312 is positioned between a pair of layout patterns of the first set of gate layout patterns 202. Each layout pattern of the set of conductive feature layout patterns 312 is positioned between a pair of gridlines of the set of gridlines 106. Other configurations or quantities of patterns in the set of conductive feature layout patterns 312 are within the scope of the present disclosure.

Layout design 300 further includes one or more conductive feature layout patterns 314a, 314b, . . . , 314k (collectively referred to as a "set of conductive feature layout patterns 314") each extending in the second direction Y. The set of conductive feature layout patterns 314 is above the set of active region layout patterns 316. In some embodiments, set of conductive feature layout patterns 314 corresponds to a second set of MD layout patterns. Set of conductive feature layout patterns 314 is usable to manufacture a corresponding second set of MD conductive features (not shown) on the M0 layer of IC 100A, 100B. In some embodiments, the second set of MD conductive features (not shown) of IC 100A, 100B are connected to source or drain diffusion regions of IC 100A, 100B.

Each layout pattern 314a, 314b, . . . , 314k of the set of conductive feature layout patterns 314 extends in the second direction Y, and is separated from each other in the first direction X. In some embodiments, a center of each layout pattern of the set of conductive feature layout patterns 314 is separated from a center of an adjacent layout pattern of the set of conductive feature layout patterns 314 in the first direction X by pitch P2. Each layout pattern of the set of conductive feature layout patterns 314 is positioned between a pair of layout patterns of the second set of gate layout patterns 204. Each layout pattern of the set of conductive feature layout patterns 314 is positioned between a pair of gridlines of the set of gridlines 106. Other configurations or quantities of patterns in the set of conductive feature layout patterns 314 are within the scope of the present disclosure.

Each layout pattern 312a, 312b, . . . , 312k of the set of conductive feature layout patterns 312 is aligned with and separated from a corresponding conductive feature layout pattern 314a, 314b, . . . , 314k of the set of conductive feature layout patterns 314 in the second direction Y.

In some embodiments, an edge of layout pattern 312a, 312b, . . . , 312k of the set of conductive feature layout patterns 312 is aligned in the second direction Y with an edge of a corresponding layout pattern 314a, 314b, . . . , 314k of the set of conductive feature layout patterns 314.

In some embodiments, a center of layout pattern 312a, 312b, . . . , 312k of the set of conductive feature layout patterns 312 is aligned in the second direction Y with a center of a corresponding layout pattern 314a, 314b, . . . , 314k of the set of conductive feature layout patterns 314.

In some embodiments, each layout pattern 312a, 312b, . . . , 312k of the set of conductive feature layout patterns 312 is separated in the second direction Y from a corresponding layout pattern 314a, 314b, . . . , 314k of the set of conductive feature layout patterns 314 by at least the pattern width $W_{1V}$.

In some embodiments, a distance between layout patterns in the first set of gate layout patterns 202 and layout patterns in the second set of gate layout patterns 204 is smaller than other approaches, causing an area of the set of active region layout patterns 316 and corresponding active regions of the set of active regions (not shown) to be larger than other approaches yielding an IC with better performance than other approaches.

Figure 4:
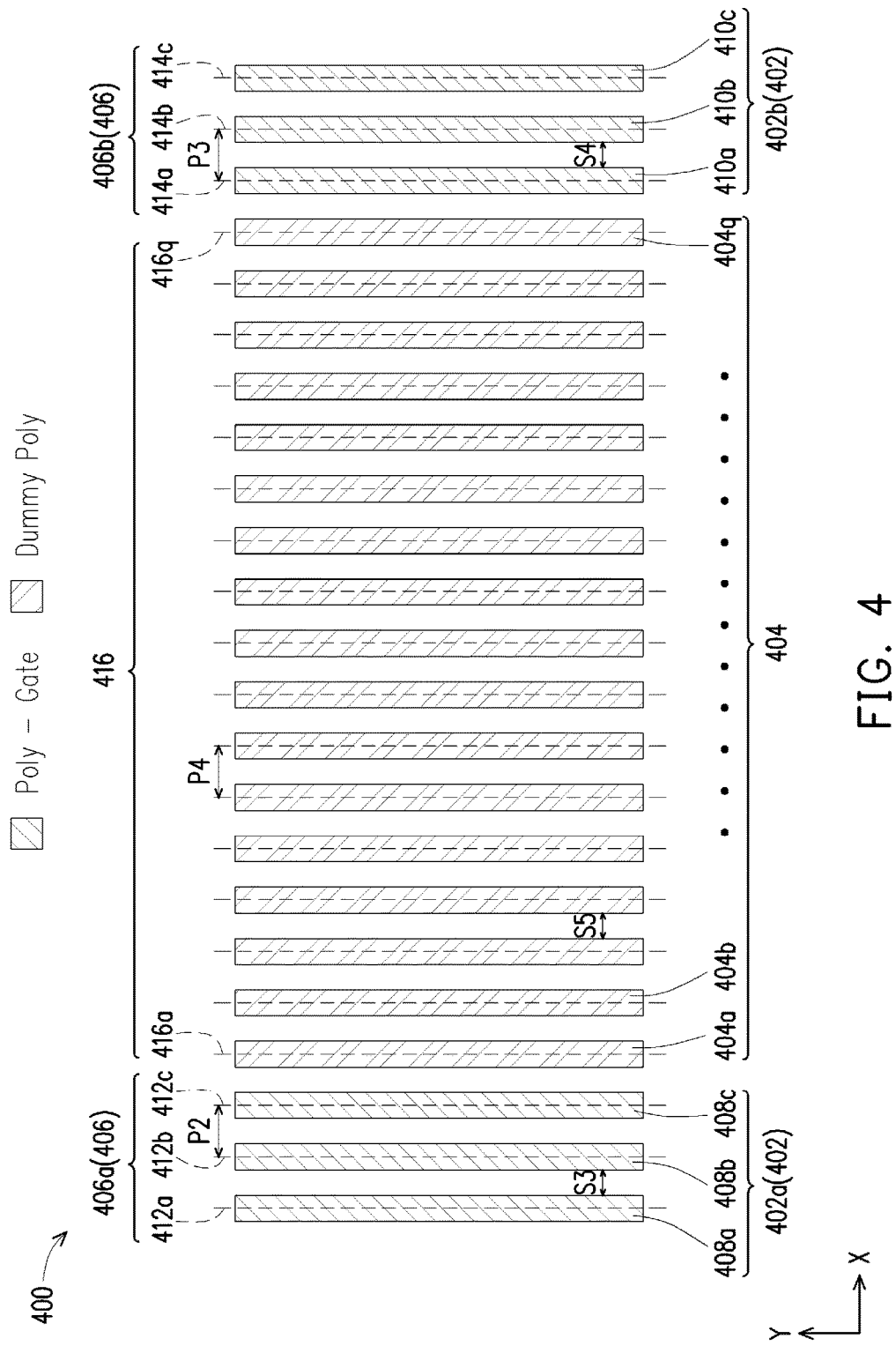
FIG. 4 is a top view of a portion of an IC, in accordance with some embodiments.

FIG. 4 is a top view of a portion of an IC 400, in accordance with some embodiments.

IC 400 is a variation of IC 100A-100B of FIGS. 1A-1B. IC 400 includes a first set of gate structures 402 and a second set of gate structures 404. In some embodiments, IC 400 corresponds to an integrated circuit after operation 604 in method 600 (FIG. 6).

In some embodiments, the first set of gate structures 402 corresponds to one or more gates of functional transistor devices. In some embodiments, the second set of gate structures 404 corresponds to one or more gates of non-functional transistor devices. In some embodiments, non-functional transistor devices are referred to as dummy transistor devices. In some embodiments, the second set of gate structures 404 are referred to as dummy gates.

The first set of gate structures 402 includes a first sub-set of gate structures 402a and a second sub-set of gate structures 402b. The first set of gate structures 402 is similar to the first set of gate structures 102 of FIGS. 1A-1B, and similar detailed description is therefore omitted.

The first sub-set of gate structures 402a includes one or more of gate structures 408a, 408b, 408c. Each gate structure 408a, 408b, 408c of the first sub-set of gate structures 402a is separated from an adjacent gate structure of the first sub-set of gate structures 402a in the first direction X by a distance S3. Each gate structure 408a, 408b, 408c of the first sub-set of gate structures 402a extends in the second direction Y. Each gate structure 408a, 408b, 408c of the first sub-set of gate structures 402a overlaps a corresponding gridline 412a, 412b, 412c (collectively referred to as "first sub-set of gridlines 406a").

The second sub-set of gate structures 402b includes one or more of gate structures 410a, 410b, 410c. Each gate structure 410a, 410b, 410c of the second sub-set of gate structures 402b is separated from an adjacent gate structure of the second sub-set of gate structures 402b in the first direction X by a distance S4. Each gate structure 410a, 410b, 410c of the second sub-set of gate structures 402b extends in the second direction Y. Each gate structure 410a, 410b, 410c of the second sub-set of gate structures 402b overlaps a corresponding gridline 414a, 414b, 414c (collectively referred to as "second sub-set of gridlines 406b").

A first set of gridlines 406 includes the first sub-set of gridlines 406a and the second sub-set of gridlines 406b. In some embodiments, the first sub-set of gridlines 406a defines regions where gate structures in the first sub-set of gate structures 402a are positioned. In some embodiments, the second sub-set of gridlines 406b defines regions where gate structures in the second sub-set of gate structures 402b are positioned. Each gridline of the first sub-set of gridlines 406a is separated from an adjacent gridline of the first sub-set of gridlines 406a by a pitch P2. Each gridline of the second sub-set of gridlines 406b is separated from an adjacent gridline of the second sub-set of gridlines 406b by a pitch P3. The first set of gridlines 406 is similar to set of gridlines 106 of FIGS. 1A-1B, and similar detailed description is therefore omitted.

The second set of gate structures 404 is positioned between the first sub-set of gate structures 402a and the second sub-set of gate structures 402b. In some embodiments, the first set of gate structures 402 alternate with the second set of gate structures 404 in the first direction X. The second set of gate structures 404 is similar to the set of gate structures 104 of FIGS. 1A-1B, and similar detailed description is therefore omitted. The second set of gate structures 404 includes one or more of gate structures 404a, 404b, . . . , 404q. In some embodiments, the second set of gate structures 404 includes 10 or more gate structures.

Each gate structure 404a, 404b, . . . , 404q of the second set of gate structures 404 is separated from an adjacent gate structure of the second set of gate structures 404 in the first direction X by a distance S5. Each gate structure 404a, 404b, . . . , 404q of the second set of gate structures 404 extends in the second direction Y. Each gate structure 404a, 404b, . . . , 404q of the second set of gate structures 404 overlaps a corresponding gridline 416a, 416b, . . . , 416q (collectively referred to as "second set of gridlines 406"). In some embodiments, the second set of gridlines 416 defines regions where gate structures in the second set of gate structures 404 are positioned. Each gridline of the second set of gridlines 416 is separated from an adjacent gridline of the second set of gridlines 416 by a pitch P4. The second set of gridlines 416 is similar to set of gridlines 106 of FIGS. 1A-1B, and similar detailed description is therefore omitted.

Other configurations or quantities of gate structures in the first sub-set of gate structures 402a, gate structures in the second sub-set of gate structures 402b, gate structures in the second set of gate structures 404 is within the contemplated scope of the present disclosure.

Other configurations or quantities of gridlines in the first sub-set of gridlines 406a, gridlines in the second sub-set of gridlines 406b, or gridlines in the second set of gridlines 416 is within the contemplated scope of the present disclosure.

In some embodiments, a side of each gate structure of the first set of gate structures 402 is aligned in the first direction X with a side of each gate structure of the second set of gate structures 404.

In some embodiments, at least one of distance S3, S4 or S5 is equal to another distance of distance S3, S4 or S5. In some embodiments, at least one of distance S3, S4 or S5 is different from another distance of distance S3, S4 or S5.

In some embodiments, at least one of pitch P2, P3 or P4 is equal to another pitch of pitch P2, P3 or P4. In some embodiments, at least one of pitch P2, P3 or P4 is different from another pitch of pitch P2, P3 or P4.

In some embodiments, a gate structure 408c of the first sub-set of gate structures 402a is directly next to or adjacent to a gate structure 404a of the second set of gate structures 404, and is separated from gate structure 404a of the second set of gate structures 404 in the first direction X by distance S3 or S5. In some embodiments, a gate structure 410a of the second sub-set of gate structures 402b is directly next to or adjacent to a gate structure 404q of the second set of gate structures 404, and is separated from gate structure 404q of the second set of gate structures 404 in the first direction X by distance S4 or S5.

In some embodiments, a gridline 412a, 412b, 412c is aligned in the second direction Y with a center or an edge of a corresponding gate structure 408a, 408b, 408c of the first sub-set of gate structures 402a.

In some embodiments, a gridline 414a, 414b, 414c is aligned in the second direction Y with a center or an edge of a corresponding gate structure 410a, 410b, 410c of the second sub-set of gate structures 402b.

In some embodiments, a gridline 416a, 416b, . . . , 416q is aligned in the second direction Y with a center or an edge of a corresponding gate structure 404a, 404b, . . . , 404q of the second set of gate structures 404.

In some embodiments, a gridline 412a, 412b, 412c, 414a, 414b, 414c, 416a, 416b, . . . , 416q is offset in the first direction X with a center of a corresponding gate structure 408a, 408b, 408c, 410a, 410b, 410c, 404a, 404b, . . . , 404q by a first distance (not shown), and another gridline 412a, 412b, 412c, 414a, 414b, 414c, 416a, 416b, . . . , 416q is offset in the first direction X with a center of the corresponding gate structure 408a, 408b, 408c, 410a, 410b, 410c, 404a, 404b, . . . , 404q by a second distance (not shown). In these embodiments, the first distance (not shown) is the same as the second distance (not shown). In these embodiments, the first distance (not shown) is different from the second distance (not shown).

In some embodiments, at least one gate structure of the first set of gate structures 402 or at least one gate structure of the second set of gate structures 404 comprises polysilicon, or the like.

Figure 5:
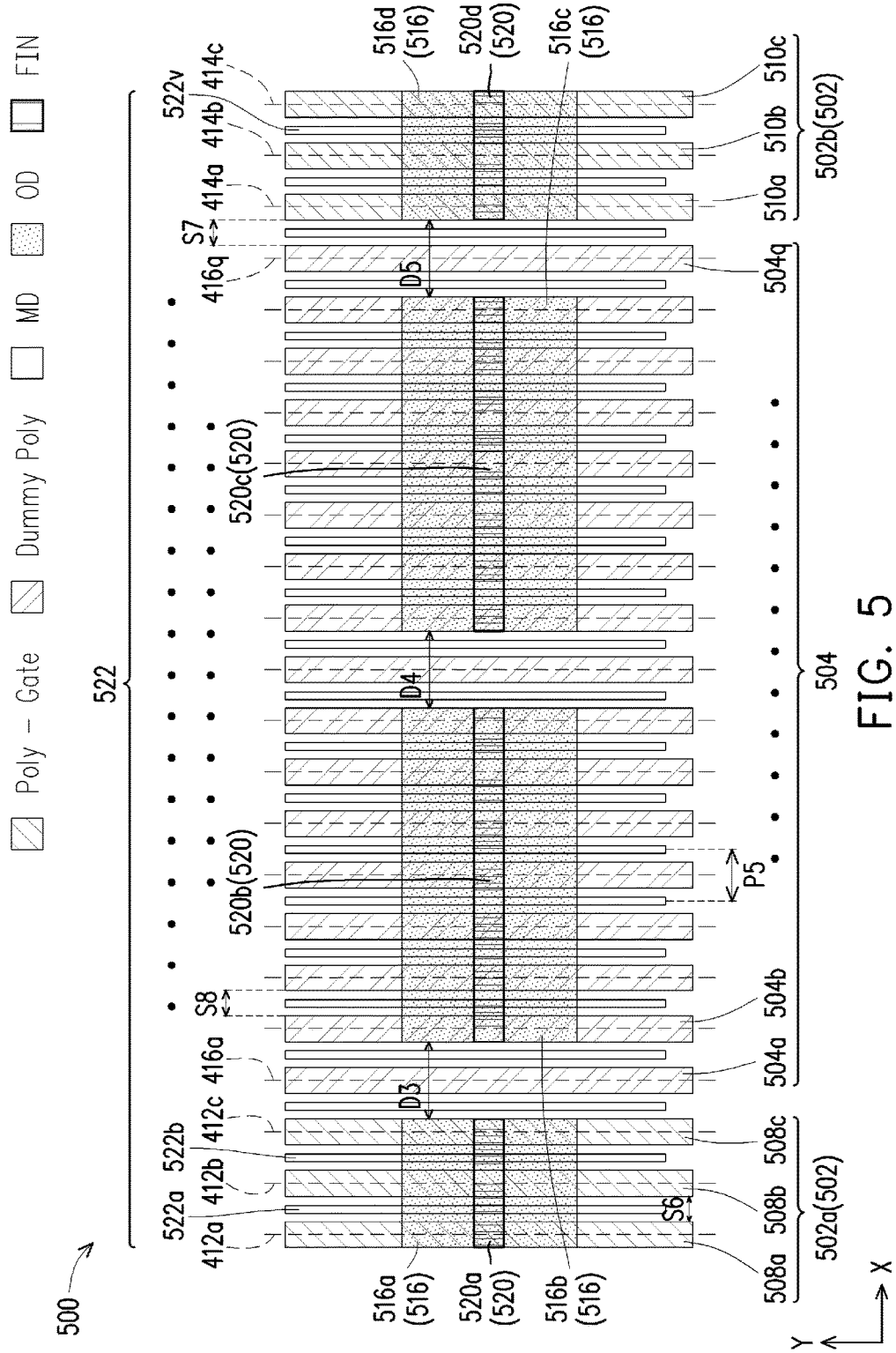
FIG. 5 is a diagram of a layout design of an IC, in accordance with some embodiments.

FIG. 5 is a diagram of a layout design 500 of an IC, in accordance with some embodiments. Layout design 500 is usable to manufacture IC 400 of FIG. 4. Structural relationships including alignment, lengths and widths, as well as configurations of layout design 500 are similar to the structural relationships and configurations of IC 400 of FIG. 400, and will not be described for brevity.

Layout design 500 includes a first set of gate layout patterns 502 and a second set of gate layout patterns 504. The first set of gate layout patterns 502 is usable to manufacture a corresponding first set of gate structures 402 (FIG. 4) of IC 400. The second set of gate layout patterns 504 is usable to manufacture a corresponding second set of gate structures 404 (FIG. 4) of IC 400.

The first set of gate layout patterns 502 extend in the second direction Y and overlap the set of gridlines 412 and 414. The first set of gate layout patterns 502 includes a first sub-set of gate layout patterns 502a and a second sub-set of gate layout patterns 502b. The first sub-set of gate layout patterns 502a is usable to manufacture a corresponding first set of gate structures 402a (FIG. 4) of IC 400. The second sub-set of gate layout patterns 502b is usable to manufacture a corresponding second set of gate structures 402b (FIG. 4) of IC 400. The first set of gate layout patterns 502 is similar to the first set of gate layout patterns 202 of FIGS. 2-3, and similar detailed description is therefore omitted.

The first sub-set of gate layout patterns 502a includes one or more of gate layout patterns 508a, 508b, 508c. Each gate layout pattern 508a, 508b, 508c of the first sub-set of gate layout patterns 502a is separated from an adjacent gate layout pattern of the first sub-set of gate layout patterns 502a in the first direction X by a distance S6. Each gate layout pattern 508a, 508b, 508c of the first sub-set of gate layout patterns 502a extends in the second direction Y. Each gate layout pattern 508a, 508b, 508c of the first sub-set of gate layout patterns 502a overlaps a corresponding gridline 412a, 412b, 412c.

The second sub-set of gate layout patterns 502b includes one or more of gate layout patterns 510a, 510b, 510c. Each gate layout pattern 510a, 510b, 510c of the second sub-set of gate layout patterns 502b is separated from an adjacent gate layout pattern of the second sub-set of gate layout patterns 502b in the first direction X by a distance S7. Each gate layout pattern 510a, 510b, 510c of the second sub-set of gate layout patterns 502b extends in the second direction Y. Each gate layout pattern 510a, 510b, 510c of the second sub-set of gate layout patterns 502b overlaps a corresponding gridline 414a, 414b, 414c.

In some embodiments, the first sub-set of gridlines 406a defines regions where gate layout patterns in the first sub-set of gate layout patterns 502a are positioned. In some embodiments, the second sub-set of gridlines 406b defines regions where gate layout patterns in the second sub-set of gate layout patterns 502b are positioned.

The second set of gate layout patterns 504 extend in the second direction Y and overlap the set of gridlines 416. The first set of gate layout patterns 502 and second set of gate layout patterns 504 are separated from each other in the first direction X by a distance S6, S7 or S8.

The second set of gate layout patterns 504 is positioned between the first sub-set of gate layout patterns 502a and the second sub-set of gate layout patterns 502b. In some embodiments, the first set of gate layout patterns 502 alternate with the second set of gate layout patterns 504 in the first direction X. The second set of gate layout patterns 504 is similar to the set of gate layout patterns 204 of FIGS. 2-3, and similar detailed description is therefore omitted. The second set of gate layout patterns 504 includes one or more of gate layout patterns 504a, 504b, . . . , 504q. In some embodiments, the second set of gate layout patterns 504 includes 10 or more gate layout patterns.

Each gate layout pattern 504a, 504b, . . . , 504q of the second set of gate layout patterns 504 is separated from an adjacent gate layout pattern of the second set of gate layout patterns 504 in the first direction X by a distance S8. Each gate layout pattern 504a, 504b, . . . , 504q of the second set of gate layout patterns 504 extends in the second direction Y. Each gate layout pattern 504a, 504b, . . . , 504q of the second set of gate layout patterns 504 overlaps a corresponding gridline 416a, 416b, . . . , 416q. In some embodiments, the second set of gridlines 416 defines regions where gate layout patterns in the second set of gate layout patterns 504 are positioned.

In some embodiments, a side of each gate layout pattern of the first set of gate layout patterns 502 is aligned in the first direction X with a side of each gate layout pattern of the second set of gate layout patterns 504.

In some embodiments, at least one of distance S6, S7 or S8 is equal to another distance of distance S6, S7 or S8. In some embodiments, at least one of distance S6, S7 or S8 is different from another distance of distance S6, S7 or S8.

In some embodiments, at least one of pitch P2, P3, P4 or P5 is equal to another pitch of pitch P2, P3, P4 or P5. In some embodiments, at least one of pitch P2, P3, P4 or P5 is different from another pitch of pitch P2, P3, P4 or P5.

In some embodiments, a gate layout pattern 508c of the first sub-set of gate layout patterns 502a is directly next to or adjacent to a gate layout pattern 504a of the second set of gate layout patterns 504, and is separated from gate layout pattern 504a of the second set of gate layout patterns 504 in the first direction X by distance S6 or S7. In some embodiments, a gate layout pattern 510a of the second sub-set of gate layout patterns 502b is directly next to or adjacent to a gate layout pattern 504q of the second set of gate layout patterns 504, and is separated from gate layout pattern 504q of the second set of gate layout patterns 504 in the first direction X by distance S7 or S8.

In some embodiments, a gridline 412a, 412b, 412c is aligned in the second direction Y with a center or an edge of a corresponding gate layout pattern 508a, 508b, 508c of the first sub-set of gate layout patterns 502a.

In some embodiments, a gridline 414a, 414b, 414c is aligned in the second direction Y with a center or an edge of a corresponding gate layout pattern 510a, 510b, 510c of the second sub-set of gate layout patterns 502b.

In some embodiments, a gridline 416a, 416b, . . . , 416q is aligned in the second direction Y with a center or an edge of a corresponding gate layout pattern 504a, 504b, . . . , 504q of the second set of gate layout patterns 504.

In some embodiments, a gridline 412a, 412b, 412c, 414a, 414b, 414c, 416a, 416b, . . . , 416q is offset in the first direction X with a center of a corresponding gate layout pattern 508a, 508b, 508c, 510a, 510b, 510c, 504a, 504b, . . . , 504q by a first distance (not shown), and another gridline 412a, 412b, 412c, 414a, 414b, 414c, 416a, 416b, . . . , 416q is offset in the first direction X with a center of the corresponding gate layout pattern 508a, 508b, 508c, 510a, 510b, 510c, 504a, 504b, . . . , 504q by a second distance (not shown). In these embodiments, the first distance (not shown) is the same as the second distance (not shown). In these embodiments, the first distance (not shown) is different from the second distance (not shown).

Other configurations or quantities of gate layout patterns in the first sub-set of gate layout patterns 502a, gate layout patterns in the second sub-set of gate layout patterns 502b or gate layout patterns in the second set of gate layout patterns 504 is within the contemplated scope of the present disclosure.

Layout design 500 further includes one or more active region layout patterns 516a, 516b, 516c, 516d, 516d (collectively referred to as "set of active region layout patterns 516") each extending in the first direction X. The set of active region layout patterns 516 is below the first set of gate layout patterns 502 and the second set of gate layout patterns 504. Set of active region layout patterns 516 is usable to manufacture a corresponding set of active regions (not shown) of IC 400. In some embodiments, set of active regions (not shown) of IC 400 is referred to as an OD region of IC 400 which defines the source or drain diffusion regions of IC 400. Each layout pattern 516*a*, 516*b*, 516*c*, 516*d* of the set of active region layout patterns 516 is separated from each other in the first direction X.

An edge of active region layout pattern 516*a* is separated from a first edge of active region layout pattern 516*b* by a distance D3. A second edge of active region layout pattern 516*b* is separated from a first edge of active region layout pattern 516*c* by a distance D4. A second edge of active region layout pattern 516*c* is separated from an edge of active region layout pattern 516*d* by a distance D5. In some embodiments, at least one of distance D3, D4 or D5 is equal to another distance of distances D3, D4 or D5. In some embodiments, at least one of distance D3, D4 or D5 is different from another distance of distances D3, D4 or D5. In some embodiments, at least two patterns of active region layout pattern 516*a*, 516*b*, 516*c*, 516*d* are part of a same, continuous active region layout pattern in the set of active region layout patterns 516. In some embodiments, at least one pattern of active region layout pattern 516*a*, 516*b*, 516*c*, 516*d* includes two or more discontinuous active region layout patterns. Other configurations or quantities of patterns in the set of active region layout patterns 516 are within the scope of the present disclosure.

Layout design 500 further includes one or more fin layout patterns 520*a*, 520*b*, 520*c*, 520*d* (collectively referred to as "set of fin layout patterns 520") each extending in the first direction X. The set of fin layout patterns 520 are below the first set of gate layout patterns 502 and the second set of gate layout patterns 504. Fin layout patterns 520*a*, 520*b*, 520*c*, 520*d* are over corresponding active region layout pattern 516*a*, 516*b*, 516*c*, 516*d*. Each of the layout patterns of the set of fin layout patterns 520 is separated from an adjacent layout pattern of the set of fin layout patterns 520 in the first direction X. The set of fin layout patterns 520 is usable to manufacture a corresponding set of fins (not shown) of IC 400. Other configurations or quantities of fins in the set of fin layout patterns 520 are within the scope of the present disclosure.

Layout design 500 further includes one or more conductive feature layout patterns 522*a*, 522*b*, . . . , 522*q* (collectively referred to as a "set of conductive feature layout patterns 522") each extending in the first direction X. The set of conductive feature layout patterns 522 is above the set of active region layout patterns 516. In some embodiments, set of conductive feature layout patterns 522 corresponds to a set of MD layout patterns. Set of conductive feature layout patterns 522 is usable to manufacture a corresponding set of MD conductive features (not shown) on the M0 layer of IC 400. In some embodiments, the first set of MD conductive features (not shown) of IC 400 are connected to source or drain diffusion regions of IC 400.

Each layout pattern 522*a*, 522*b*, . . . , 522*q* of the set of conductive feature layout patterns 522 extends in the second direction Y, and is separated from each other in the first direction X. In some embodiments, a center of each layout pattern of the set of conductive feature layout patterns 522 is separated from a center of an adjacent layout pattern of the set of conductive feature layout patterns 522 in the first direction X by a pitch P5.

Each layout pattern of the set of conductive feature layout patterns 522 is positioned between a pair of layout patterns of the first set of gate layout patterns 502 and the second set of gate layout patterns 504. Each layout pattern of the set of conductive feature layout patterns 522 is positioned between a pair of gridlines of the first set of gridlines 406 and the second set of gridlines 416. In some embodiments, an edge of at least one layout pattern 522*a*, 522*b*, . . . , 522*v* of the set of conductive feature layout patterns 522 is aligned in the first direction X with at least an edge of another layout pattern 522*a*, 522*b*, . . . , 522*v* of the set of conductive feature layout patterns 522. Other configurations or quantities of patterns in the set of conductive feature layout patterns 522 are within the scope of the present disclosure.

In some embodiments, a distance between layout patterns in the first sub-set of gate layout patterns 502*a* and layout patterns in the second set of gate layout patterns 504 is smaller than other approaches causing an area of layout design 500 to be smaller than other approaches. In some embodiments, by placing the first sub-set of gate layout patterns 502*a* and layout patterns in the second set of gate layout patterns 504 closer together than other approaches results in a layout design 500 with more uniform gate pattern density causing less dishing from CMP processes than other approaches. In some embodiments, by placing the first sub-set of gate layout patterns 502*a* and layout patterns in the second set of gate layout patterns 504 closer together than other approaches results in a layout design 500 with less polysilicon stitching than other approaches. In some embodiments, a distance between layout patterns in the second sub-set of gate layout patterns 502*b* and layout patterns in the second set of gate layout patterns 504 is smaller than other approaches causing an area of layout design 500 to be smaller than other approaches. In some embodiments, by placing the second sub-set of gate layout patterns 502*b* and layout patterns in the second set of gate layout patterns 504 closer together than other approaches results in a layout design 500 with more uniform gate pattern density causing less dishing from CMP processes than other approaches. In some embodiments, by placing the second sub-set of gate layout patterns 502*b* and layout patterns in the second set of gate layout patterns 504 closer together than other approaches results in a layout design 500 with less polysilicon stitching than other approaches. In some embodiments, a distance between layout patterns in the first sub-set of gate layout patterns 502*a* and layout patterns in the second sub-set of gate layout patterns 502*b* is smaller than other approaches causing an area of layout design 500 to be smaller than other approaches. In some embodiments, by placing the first sub-set of gate layout patterns 502*a* and layout patterns in the second sub-set of gate layout patterns 502*b* closer together than other approaches results in a layout design 500 with more uniform gate pattern density causing less dishing from CMP processes than other approaches. In some embodiments, by placing the first sub-set of gate layout patterns 502*a* and layout patterns in the second sub-set of gate layout patterns 502*b* closer together than other approaches results in a layout design 500 with less polysilicon stitching than other approaches. In some embodiments, a distance between two layout patterns in the first sub-set of gate layout patterns 502*a*, the second sub-set of gate layout patterns 504*b* and the second set of gate layout patterns 504 is smaller than other approaches causing an area of set of active region layout patterns 516 and corresponding active regions of the set of active regions (not shown) to be larger than other approaches yielding an IC with better performance than other approaches.

FIG. 6 is a flowchart of a method 600 of forming an integrated circuit in accordance with some embodiments. It is understood that additional operations may be performed before, during, and/or after the method 600 depicted in FIG. 6, and that some other processes may only be briefly described herein. In some embodiments, the method 600 is usable to form integrated circuits, such as IC 100A (FIG. 1A) or integrated circuit 400 (FIG. 4).

In operation 602 of method 600, a layout design 200 (FIG. 2) of an integrated circuit (e.g., IC 100A or 100B (FIGS. 1A-1B)) is generated. Operation 602 is performed by a processing device (e.g., processor 802 (FIG. 8)) configured to execute instructions for generating a layout design (e.g., layout design 200). In some embodiments, the layout design 200 is a graphic database system (GDSII) file format. In some embodiments, operation 602 of method 600 is utilized to generate a layout design 300 (FIG. 3) or layout design 500 (FIG. 5). In some embodiments, operation 602 of method 600 generates one or more layout designs having a first set of gate layout patterns and a second set of gate layout patterns closer together than other approaches resulting in the one or more layout designs having a more uniform gate pattern density than other approaches. In some embodiments, operation 602 of method 600 generates one or more layout designs having one or more of the advantages described in FIG. 2-3 or 5, and similar detailed description is therefore omitted.

Method 600 continues with operation 604, where the integrated circuit (e.g., IC 100B (FIG. 1B)) is manufactured based on the layout design 200 (FIG. 2). In some embodiments, IC 100B (FIG. 1B) includes gate structure 108. In some embodiments, the gate structure 108 is located on gate or poly layer (PO) of IC 100A or 100B. In some embodiments, operation 604 comprises manufacturing at least one mask based on the layout design 200 (FIG. 2), and manufacturing the integrated circuit (e.g., IC 100B (FIG. 1B)) based on the at least one mask.

Method 600 continues with operation 606, where gate structure 108 (gate structure 108a, 108b, . . . , 108l) is removed thereby forming a first gate structure (e.g., gate structure 102a, 102b, . . . , 102l) and a second gate structure (e.g., gate structures 104a, 104b, . . . , 104l) of integrated circuit (e.g., IC 100A (FIG. 1A)). In some embodiments, the removed portion of the gate structure 108 (gate structure 108a, 108b, . . . , 108l) corresponds to a cut region (e.g., poly cut feature layout pattern 210 (FIG. 2)). In some embodiments, operation 606 of method 600 is referred to as a cut-poly (CPO) process. In some embodiments, operation 606 results in the formation of IC 100A (FIG. 1A).

In some embodiments, the portion of the gate structure 108 that is removed in operation 606 is identified in layout designs 200 and 300 by poly cut feature layout pattern 210 (FIGS. 2-3). In some embodiments, the poly cut feature layout pattern 210 identifies a location of the removed portion of the gate structure 108 of IC 100B.

In some embodiments, the removed portion of each gate 108a, 108b, . . . , 108l comprises cut width $D_V$ (FIG. 1) in second direction Y, and cut length $D_H$ (FIG. 1) in first direction X. In some embodiments, the poly cut feature layout pattern 210 (FIG. 2) comprises a pattern width $W_{1V}$ in the second direction Y, and a pattern length L in the first direction X. In some embodiments, the pattern width $W_{1V}$ corresponds to the cut width $D_V$ of each gate structure 102a, 102b, . . . , 102l or gate structure 104a, 104b, . . . , 104l.

In some embodiments, the pattern width $W_{1H}$ of each gate layout pattern 202a, 202b, . . . , 202l corresponds to the cut width $D_H$ of each corresponding gate structure 102a, 102b, . . . , 102l. In some embodiments, the pattern width $W_{1H}$ of each gate layout pattern 204a, 204b, . . . , 204l corresponds to the cut width $D_H$ of each corresponding gate structure 104a, 104b, . . . , 104l.

In some embodiments, operation 606 of method 600 is performed on gate structures in IC 100A that are not sufficiently separated from each other in the second direction Y to ensure a consistent manufactured yield. For example, in these embodiments, if the distance $D_V$ between gate structure 102a, 102b, . . . , 102l and corresponding gate structure 104a, 104b, . . . , 104l in the second direction Y is less than a minimum distance (e.g., dependent upon manufacturing process), then gate structure 102a, 102b, . . . , 102l and corresponding gate structure 104a, 104b, . . . , 104l are not sufficiently separated from each other to ensure a consistent manufactured yield, and therefore operation 606 of method 600 is applied to ensure sufficient separation between gate structure 102a, 102b, . . . , 102l and corresponding gate structure 104a, 104b, . . . , 104l. The minimum distance is the minimum spacing between conductive structures manufactured to ensure a consistent yield.

In some embodiments, if the distance $D_V$ between gate structure 102a, 102b, . . . , 102l and corresponding gate structure 104a, 104b, . . . , 104l in the second direction Y is greater than a minimum distance (e.g., dependent upon manufacturing process), then operation 606 of method 600 is not performed (e.g., optional) on gate structure 102a, 102b, . . . , 102l and corresponding gate structure 104a, 104b, . . . , 104l.

In some embodiments, the area of the cut feature layout pattern (e.g., poly cut feature layout pattern 210) is less than or equal to an area of the removed portion of the gate structure 108 of IC 100B. In some embodiments, the area of the removed portion of the gate structure 108 of IC 100B is based upon the cut width $D_V$ and the cut length $D_H$ of each corresponding gate structure 102a, . . . , 102l or 104a, . . . , 104l. In some embodiments, the area of the cut feature layout pattern (e.g., poly cut feature layout pattern 210) is greater than the area of the removed portion of the gate structure 108 of IC 100B.

In some embodiments, operation 606 is performed by a removal process. In some embodiments, the removal process includes one or more etching processes suitable to remove a portion of gate structure 108. In some embodiments, the etching process of operation 606 includes identifying a portion of the gate structure 108 that is to be removed, and etching the portion of the gate structure 108 that is to be removed. In some embodiments, a mask is used to specify portions of the gate structure 108 that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like. In some embodiments, operation 604 or 606 of method 600 is useable to manufacture one or more integrated circuits having one or more of the advantages described in FIG. 1A-1B or 4, and similar detailed description is therefore omitted.

In some embodiments, method 600 is utilized with layout designs other than layout design 200. For example, in some embodiments, layout design 200 (FIG. 2) of operation 602 or 604 is replaced with one or more of layout design 300 (FIG. 3) or layout design 500 (FIG. 5). In some embodiments, layout design 200 of operations 602 and 604 is replaced with layout design 300 (FIG. 3) to manufacture IC 100B (FIG. 1B). In some embodiments, layout design 200 of operations 602 and 604 is replaced with layout design 500 (FIG. 5) to manufacture integrated circuit 400 (FIG. 4).

In some embodiments, operation 606 is not performed. For example, in some embodiments, operation 606 is not performed to manufacture integrated circuit 400 (FIG. 4). In some embodiments, method 600 is performed to manufacture integrated circuit 400 (FIG. 400) using layout design 500, and operation 606 is not performed using integrated circuit 400 (FIG. 4). In some embodiments, method 600 utilizes one or more layout patterns with more regular gate layout patterns than other approaches yielding greater process control (e.g., etching) than other approaches. In some embodiments, method 600 utilizes one or more gate layout patterns (e.g., first set of gate layout patterns 202, second set of gate layout patterns 204, first sub-set of gate layout patterns 502*a*, second sub-set of gate layout patterns 504*b* or second set of gate layout patterns 504) that are aligned with corresponding gridlines (e.g., gridlines 106, gridlines 406 or gridlines 416) in the first direction or the second direction yielding greater process control (e.g., etching) than other approaches.

Figure 7:
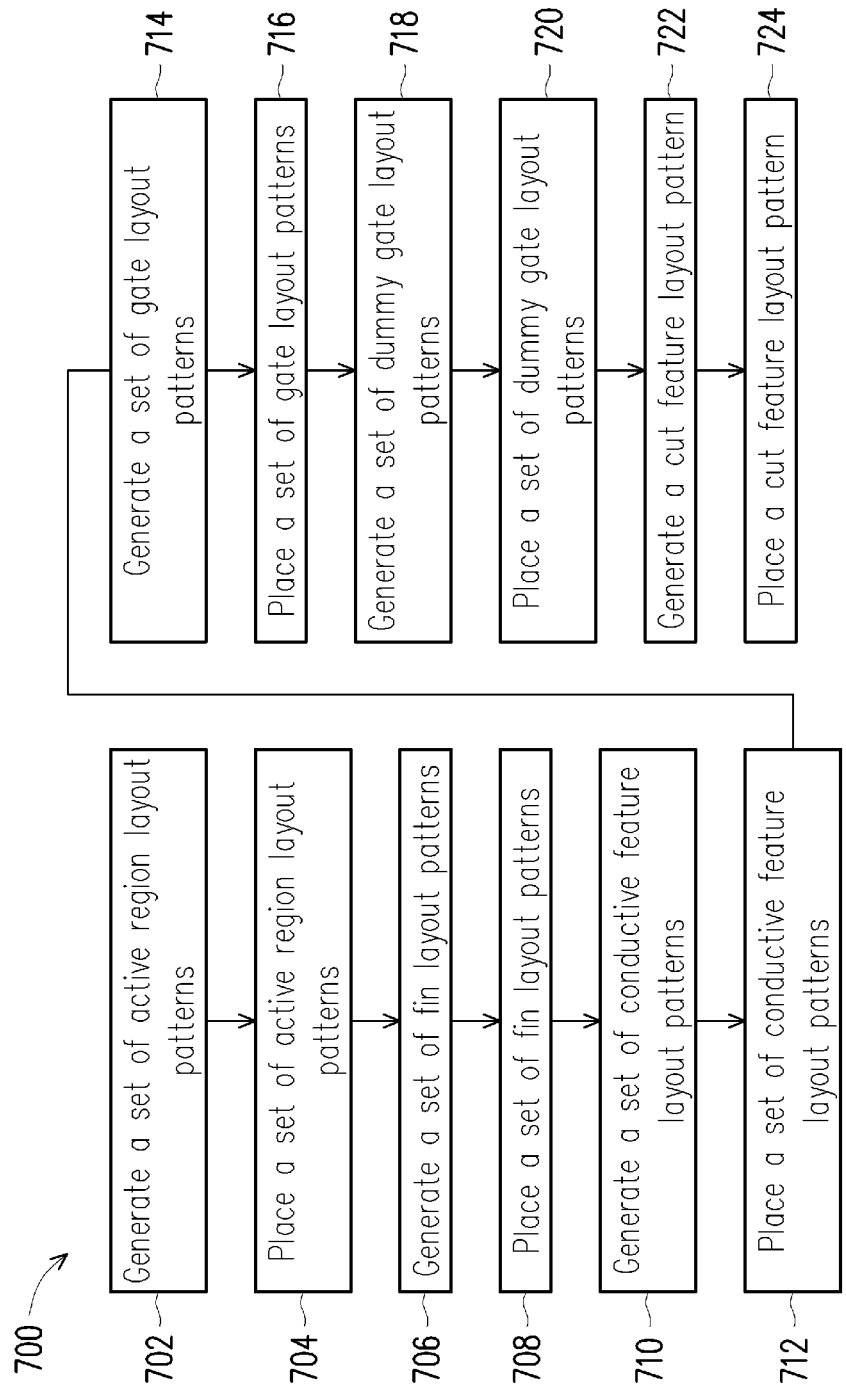
FIG. 7 is a flowchart of a method of generating a layout design of an integrated circuit, in accordance with some embodiments.

FIG. 7 is a flowchart of a method 700 of generating a layout design of an IC in accordance with some embodiments. It is understood that additional operations may be performed before, during, and/or after the method 700 depicted in FIG. 7, and that some other processes may only be briefly described herein. In some embodiments, the method 700 is usable to generate one or more layout designs, such as layout design 200 (FIG. 2), layout design 300 (FIG. 3) or layout design 500 (FIG. 5) of an integrated circuit, such as IC 100A-100B (FIG. 1) or integrated circuit 400 (FIG. 4). In some embodiments, the method 700 is usable to form integrated circuits having similar structural relationships as one or more of layout designs 200-300 or 500 (FIG. 2-3 or 5). In some embodiments, method 700 is performed by a processing device (e.g., processor 802 (FIG. 8)) configured to execute instructions for generating a layout design 200, 300 or 500.

In operation 702 of method 700, a set of active region layout patterns is generated.

In some embodiments, the set of active region layout patterns of method 700 includes one or more patterns of the set of active region layout patterns 316 of FIG. 3 and set of active region layout patterns 516 of FIG. 5, and detailed description of these layout patterns is therefore omitted.

In operation 704 of method 700, the set of active region layout patterns is placed on a first layout level of the layout design 200, 300 or 500. In some embodiments, the first layout level corresponds to the OD layout level.

In operation 706 of method 700, a set of fin layout patterns is generated. In some embodiments, the set of fin layout patterns of method 700 includes one or more patterns of the set of fin layout patterns 320 of FIG. 3 and set of fin layout patterns 520 of FIG. 5, and detailed description of these layout patterns is therefore omitted.

In operation 708 of method 700, the set of fin layout patterns is placed on a second layout level of layout design 200, 300 or 500. In some embodiments, the second layout level corresponds to the FIN layout level. In some embodiments, the second layout level is different from the first layout level. In some embodiments, the second layout level is above the first layout level. In some embodiments, the second layout level is below the first layout level.

In operation 710 of method 700, a set of conductive feature layout patterns is generated. In some embodiments, the set of conductive feature layout patterns of method 700 includes one or more patterns of the set of conductive feature layout patterns 312 of FIG. 3, set of conductive feature layout pattern 314 of FIG. 3 and set of conductive feature layout patterns 522 of FIG. 5, and detailed description of these layout patterns is therefore omitted.

In operation 712 of method 700, the set of conductive feature layout patterns is placed on a third layout level of layout design 200, 300 or 500. In some embodiments, the third layout level corresponds to the MD layout level. In some embodiments the third layout level corresponds to the M0 layout level. In some embodiments, the third layout level is different from the first layout level and the second layout level. In some embodiments, the third layout level is above one or more of the first or second layout level. In some embodiments, the third layout level is below one or more of the first or second layout level.

In operation 714 of method 700, a set of gate layout patterns is generated. In some embodiments, the set of gate layout patterns of method 700 includes one or more patterns of the first set of gate layout patterns 202 of FIGS. 2-3, second set of gate layout pattern 204 of FIGS. 2-3, first set of gate layout patterns 502 of FIG. 5, first sub-set of gate layout patterns 502*a* of FIG. 5, second sub-set of gate layout patterns 502*b* of FIG. 5 and second set of gate layout patterns 504, and detailed description of these layout patterns is therefore omitted.

In operation 716 of method 700, the set of gate layout patterns is placed on a fourth layout level of layout design 200, 300 or 500. In some embodiments, the fourth layout level corresponds to the Poly layout level. In some embodiments, the fourth layout level is different from the first layout level, the second layout level and the third layout level. In some embodiments, the fourth layout level is above one or more of the first, second or third layout level. In some embodiments, the fourth layout level is below one or more of the first, second or third layout level.

In operation 718 of method 700, a set of dummy gate layout patterns is generated. In some embodiments, the set of dummy gate layout patterns of method 700 includes one or more patterns of the first set of gate layout patterns 202 of FIGS. 2-3, second set of gate layout pattern 204 of FIGS. 2-3, first set of gate layout patterns 502 of FIG. 5, first sub-set of gate layout patterns 502*a* of FIG. 5, second sub-set of gate layout patterns 502*b* of FIG. 5 and second set of gate layout patterns 504, and detailed description of these layout patterns is therefore omitted.

In operation 720 of method 700, the set of dummy gate layout patterns is placed on the fourth layout level of layout design 200, 300 or 500.

In operation 722 of method 700, a cut feature layout pattern is generated. In some embodiments, the cut feature layout pattern of method 700 includes poly cut feature layout pattern 210 of FIGS. 2-3, and detailed description of these layout patterns is therefore omitted.

In operation 724 of method 700, the cut feature layout pattern is placed on the fourth layout level of layout design 200, 300 or 500.

In some embodiments, one or more of operations 702, 704, 706, 708, 710, 712, 714, 716, 718, 720, 722 or 724 of method 700 is not performed.

One or more of the operations of methods 600-700 is performed by a processing device configured to execute instructions for manufacturing an integrated circuit, such as IC 100A-100B or 400. In some embodiments, one or more operations of methods 600-700 is performed using a same processing device as that used in a different one or more operations of methods 600-700. In some embodiments, a different processing device is used to perform one or more operations of methods 600-700 from that used to perform a different one or more operations of methods 600-700. In some embodiments, method 700 generates one or more layout designs having one or more of the advantages described in FIG. 2-3 or 5, and similar detailed description is therefore omitted.

Figure 8:
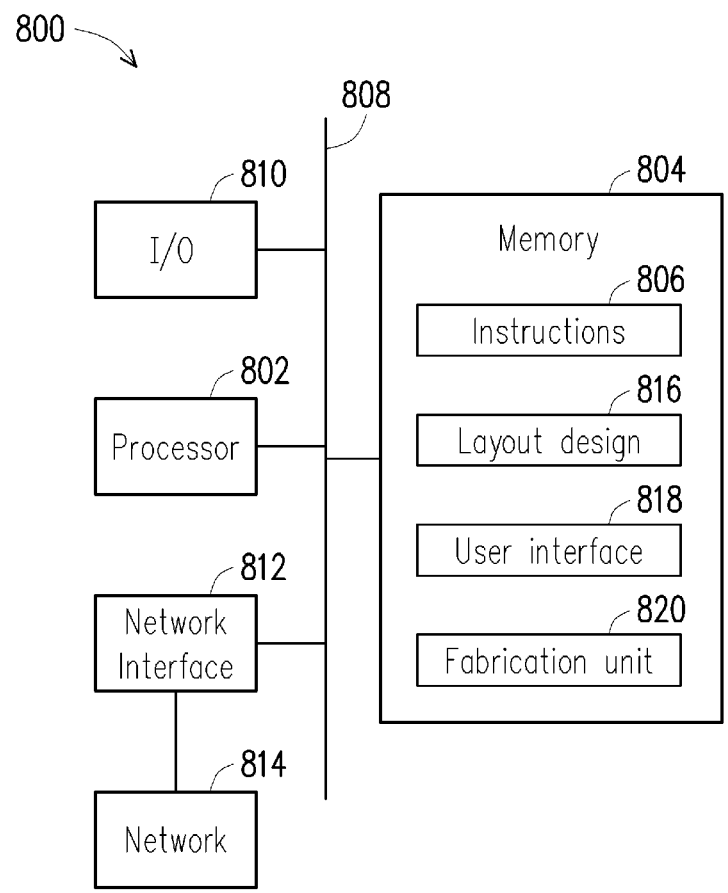
FIG. 8 is a block diagram of a system of designing an IC layout design, in accordance with some embodiments.

FIG. 8 is a schematic view of a system 800 for designing an IC layout design in accordance with some embodiments. In some embodiments, system 800 generates or places one or more IC layout designs described herein. System 800 includes a hardware processor 802 and a non-transitory, computer readable storage medium 804 encoded with, i.e., storing, the computer program code 806, i.e., a set of executable instructions. Computer readable storage medium 804 is configured for interfacing with manufacturing machines for producing the integrated circuit. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described in method 600 or 700. In some embodiments, system 900 includes an automatic placement and routing (APR) system.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform method 600 or 700. In some embodiments, the storage medium 804 also stores information needed for performing method 600 or 700 as well as information generated during performing method 600 or 700, such as layout design 816, user interface 818 and fabrication unit 820, and/or a set of executable instructions to perform the operation of method 600 or 700. In some embodiments, layout design 816 comprises one or more of layout designs 200-300 or 500.

In some embodiments, the storage medium 804 stores instructions (e.g., computer program code 806) for interfacing with manufacturing machines. The instructions (e.g., computer program code 806) enable processor 802 to generate manufacturing instructions readable by the manufacturing machines to effectively implement method 600 or 700 during a manufacturing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-1394. In some embodiments, method 600 or 700 is implemented in two or more systems 800, and information such as layout design, user interface and fabrication unit are exchanged between different systems 800 by network 814.

System 800 is configured to receive information related to a layout design through I/O interface 810 or network interface 812. The information is transferred to processor 802 by bus 808 to determine a layout design for producing IC 100A-100B or 400. The layout design is then stored in computer readable medium 804 as layout design 816. System 800 is configured to receive information related to a user interface through I/O interface 810 or network interface 812. The information is stored in computer readable medium 804 as user interface 818. System 800 is configured to receive information related to a fabrication unit through I/O interface 810 or network interface 812. The information is stored in computer readable medium 804 as fabrication unit 820. In some embodiments, the fabrication unit 820 includes fabrication information utilized by system 1000 (FIG. 10).

In some embodiments, method 600 or 700 is implemented as a standalone software application for execution by a processor. In some embodiments, method 600 or 700 is implemented as a software application that is a part of an additional software application. In some embodiments, method 600 or 700 is implemented as a plug-in to a software application. In some embodiments, method 600 or 700 is implemented as a software application that is a portion of an EDA tool. In some embodiments, method 600 or 700 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 600 or 700 is implemented by a manufacturing device to manufacture an integrated circuit (e.g., IC 100A-100B or 400) using a set of masks manufactured based on one or more layout designs (e.g., layout design 200-300, or 500) generated by system 800. System 800 of FIG. 8 generates one or more layout designs (e.g., layout design 200-300 or 500) of an integrated circuit (e.g, IC 100A-100B or 400) that have a smaller area than other approaches.

Figure 9:
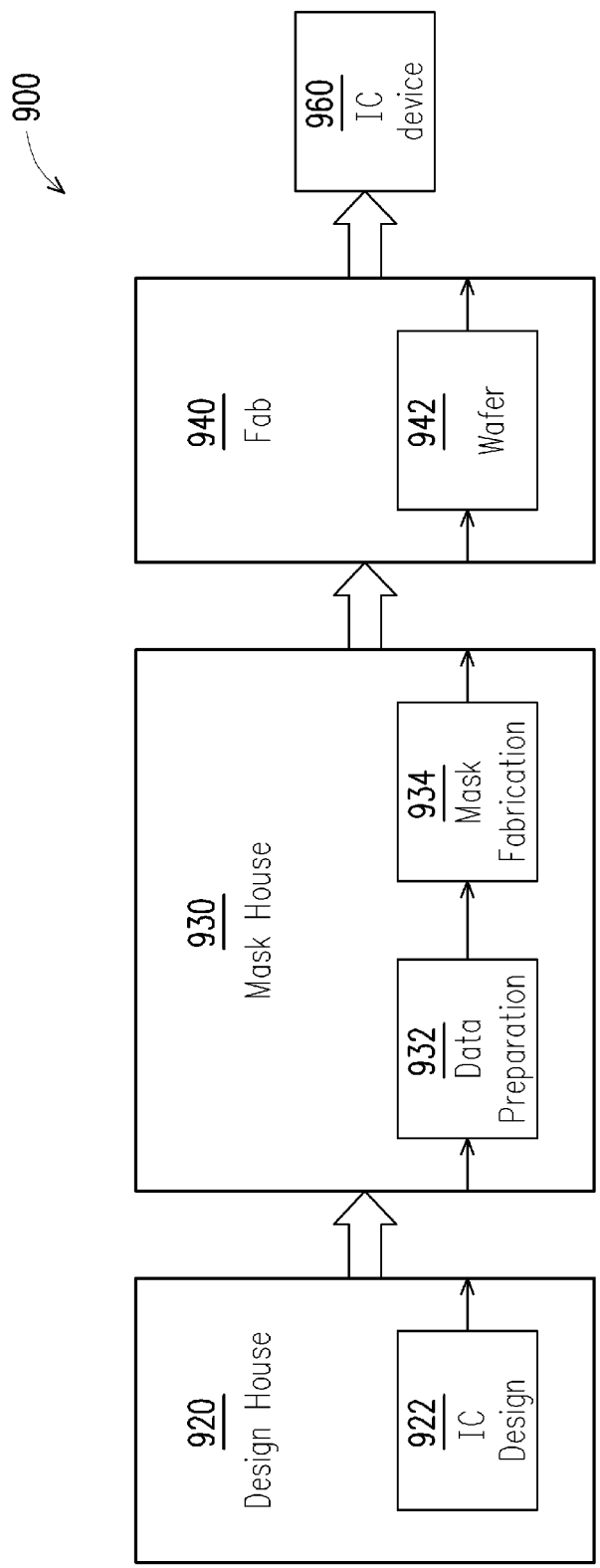
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with at least one embodiment of the present disclosure.

In FIG. 9, IC manufacturing system 900 includes entities, such as a design house 920, a mask house 930, and an IC manufacturer/fabricator ("fab") 940, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 940 is owned by a single larger company. In some embodiments, two or more of design house 920, mask house 930, and IC fab 940 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout 922. The design procedure includes one or more of logic design, physical design or place and route. IC design layout 922 is presented in one or more data files having information of the geometrical patterns. For example, IC design layout 922 can be expressed in a GDSII file format or DFII file format.

Mask house 930 includes data preparation 952 and mask fabrication 944. Mask house 930 uses IC design layout 922 to manufacture one or more masks to be used for fabricating the various layers of IC device 960 according to IC design layout 922. Mask house 930 performs mask data preparation 952, where IC design layout 922 is translated into a representative data file ("RDF"). Mask data preparation 952 provides the RDF to mask fabrication 944. Mask fabrication 944 includes a mask writer. A mask writer converts the RDF to an image on a substrate, such as a mask (reticle) or a semiconductor wafer. The design layout is manipulated by mask data preparation 952 to comply with particular characteristics of the mask writer and/or requirements of IC fab 940. In FIG. 9, mask data preparation 952 and mask fabrication 944 are illustrated as separate elements. In some embodiments, mask data preparation 952 and mask fabrication 944 can be collectively referred to as mask data preparation.

In some embodiments, mask data preparation 952 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 952 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 952 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 944, which may undo part of the modifications performed by OPC in order to meet mask creation rules.

In some embodiments, mask data preparation 952 includes lithography process checking (LPC) that simulates processing that will be implemented by IC fab 940 to fabricate IC device 960. LPC simulates this processing based on IC design layout 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 922.

It should be understood that the above description of mask data preparation 952 has been simplified for the purposes of clarity. In some embodiments, data preparation 952 includes additional features such as a logic operation (LOP) to modify the IC design layout according to manufacturing rules. Additionally, the processes applied to IC design layout 922 during data preparation 952 may be executed in a variety of different orders.

After mask data preparation 952 and during mask fabrication 944, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in the semiconductor wafer, in an etching process to form various etching regions in the semiconductor wafer, and/or in other suitable processes.

IC fab 940 is an IC fabrication business that includes one or more manufacturing facilities for the fabrication of a variety of different IC products. In some embodiments, IC Fab 940 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 940 uses the mask (or masks) fabricated by mask house 930 to fabricate IC device 960. Thus, IC fab 940 at least indirectly uses IC design layout 922 to fabricate IC device 960. In some embodiments, a semiconductor wafer 952 is fabricated by IC fab 940 using the mask (or masks) to form IC device 960. Semiconductor wafer 952 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method of manufacturing an integrated circuit. The method includes generating, by a processor, a layout design of the integrated circuit, manufacturing the integrated circuit based on the layout design, the integrated circuit having at least a gate structure of the set of gate structures. The method further includes removing a first portion of the gate structure of the set of gate structures to form a first gate structure and a second gate structure, and the cut feature layout pattern identifying a location of the first portion of the gate structure of the set of gate structures. In some embodiments, generating of the layout design includes generating a set of gate layout patterns corresponding to fabricating a set of gate structures of the integrated circuit, and generating a cut feature layout pattern extending in the first direction and overlapping the set of gate layout patterns. In some embodiments, generating the set of gate layout patterns corresponds to fabricating a set of gate structures of the integrated circuit, each of the layout patterns of the set of gate layout patterns being separated from an adjacent layout pattern of the set of gate layout patterns in a first direction by a first pitch, the set of gate layout patterns extending in a second direction different from the first direction and overlapping a set of gridlines, the set of gridlines extending in the second direction, and each gridline of the set of gridlines being separated from an adjacent gridline of the set of gridlines by the first pitch. In some embodiments, generating the layout design further includes generating a set of fin layout patterns corresponding to fabricating a set of fins of the integrated circuit structure, the set of fin layout patterns extending in the first direction and below the set of gate layout patterns, each of the fin layout patterns of the set of fin layout patterns being separated from an adjacent fin layout pattern of the set of fin layout patterns in the second direction by a fin pitch. In some embodiments, generating the layout pattern further includes generating a set of active region layout patterns extending in the first direction, being below the set of gate layout patterns and being separated from one another in the second direction, the set of active region layout patterns corresponding to fabricating a set of active regions of the integrated circuit. In some embodiments, manufacturing the integrated circuit based on the layout design includes manufacturing a set of masks based on the layout design; and manufacturing the integrated circuit based on the set of masks. In some embodiments, the set of gate layout patterns includes a first set of gate layout patterns corresponding to fabricating a set of functional gate structures of the integrated circuit; and a second set of gate layout patterns corresponding to fabricating a set of non-functional gate structures of the integrated circuit. In some embodiments, a layout pattern of the first set of gate layout patterns is aligned in the second direction with a corresponding layout pattern of the second set of gate layout patterns. In some embodiments, a gridline of the set of gridlines is aligned with a center of the layout pattern of the first set of gate layout patterns and a center of the corresponding layout pattern of the second set of gate layout patterns. In some embodiments, generating the layout pattern further includes generating a set of conductive feature layout patterns extending in the second direction, each layout pattern of the set of conductive feature layout patterns being separated from one another in the first direction, the set of conductive feature layout patterns corresponding to fabricating a set of conductive features of the integrated circuit. In some embodiments, a layout pattern of the set of conductive feature layout patterns is between the layout pattern of the first set of gate layout patterns and an adjacent layout pattern of the first set of gate layout patterns, or the layout pattern of the second set of gate layout patterns and an adjacent layout pattern of the second set of gate layout patterns. In some embodiments, the removing of the first portion of the gate structure includes performing an etch process on the first portion of the gate structure of the set of gate structures. In some embodiments, the first portion of the gate structure includes a cut length in the first direction, and a cut width in the second direction; and the cut feature layout pattern includes a pattern length in the first direction, and a pattern width in the second direction; the pattern width corresponds to the cut width, and the pattern length corresponds to the cut length.

Another aspect of this description relates to a method of fabricating an integrated circuit. The method includes generating, by a processor, a layout design of the integrated circuit and manufacturing the integrated circuit based on the layout design; the integrated circuit having the first set of gate structures and the second set of gate structures. In some embodiments, the generating of the layout design includes placing a first set of gate layout patterns on a first layout level and placing a second set of gate layout patterns on the first layout level. In some embodiments, the first set of gate layout patterns corresponds to fabricating a first set of gate structures of the integrated circuit, each of the layout patterns of the first set of gate layout patterns being separated from an adjacent layout pattern of the first set of gate layout patterns in a first direction by a first distance, the first set of gate layout patterns extending in a second direction different from the first direction and overlapping a first set of gridlines, the first set of gridlines extending in the second direction, and each gridline of the first set of gridlines being separated from an adjacent gridline of the first set of gridlines by a first pitch. In some embodiments, the second set of gate layout patterns corresponds to fabricating a second set of gate structures of the integrated circuit, each of the layout patterns of the second set of gate layout patterns being separated from an adjacent layout pattern of the second set of gate layout patterns in the first direction by a second distance, the second set of gate layout patterns extending in the second direction and overlapping a second set of gridlines, the second set of gridlines extending in the second direction, and each gridline of the second set of gridlines being separated from an adjacent gridline of the second set of gridlines by a second pitch. In some embodiments, the second set of gate layout patterns includes 10 or more gate layout patterns. In some embodiments, the first set of gate layout patterns alternate with the second set of gate layout patterns in the first direction. In some embodiments, a layout pattern of the first set of gate layout patterns is aligned in the first direction with a corresponding layout pattern of the second set of gate layout patterns. In some embodiments, the first distance is equal to the second distance, and the first pitch is equal to the second pitch. In some embodiments, a layout pattern of the first set of gate layout patterns is adjacent to a layout pattern of the second set of gate layout patterns, and is separated from the layout pattern of the second set of gate layout patterns in the first direction by the first distance or the second distance.

Still another aspect of this disclosure relates to an integrated circuit. The integrated circuit includes a first set of gate structures and a second set of gate structures. In some embodiments, a center of each gate of the first set of gate structures being separated from a center of an adjacent gate of the first set of gate structures in a first direction by a first pitch, the first set of gate structures extending in a second direction different from the first direction. In some embodiments, a center of each gate of the second set of gate structures being separated from a center of an adjacent gate of the second set of gate structures in the first direction by the first pitch, the second set of gate structures extending in the second direction. In some embodiments, a gate of the first set of gate structures is aligned in the second direction with a corresponding gate of the second set of gate structures. In some embodiments, the gate of the first set of gate structures is separated from the corresponding gate of the second set of gate structures in the second direction by a first distance. In some embodiments, the first set of gate structures is a set of functional gate structures, and the second set of gate structures is a set of non-functional gate structures. In some embodiments, the first distance ranges from about 0.01 μm to about 0.06 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   generating, by a processor, a layout design of the integrated circuit, wherein generating the layout design comprises:
      generating a set of gate layout patterns corresponding to fabricating a set of gate structures of the integrated circuit, each of the layout patterns of the set of gate layout patterns being separated from an adjacent layout pattern of the set of gate layout patterns in a first direction by a first pitch, the set of gate layout patterns extending in a second direction different from the first direction and overlapping a set of gridlines, the set of gridlines extending in the second direction, and each gridline of the set of gridlines being separated from an adjacent gridline of the set of gridlines by the first pitch; and
      generating a cut feature layout pattern extending in the first direction and overlapping the set of gate layout patterns;
   manufacturing the integrated circuit based on the layout design, the integrated circuit having at least a gate structure of the set of gate structures; and
   removing a first portion of the gate structure of the set of gate structures to form a first gate structure and a second gate structure, and the cut feature layout pattern identifying a location of the first portion of the gate structure of the set of gate structures.

2. The method of claim 1, wherein generating the layout design further comprises:
   generating a set of fin layout patterns corresponding to fabricating a set of fins of the integrated circuit, the set of fin layout patterns extending in the first direction and below the set of gate layout patterns, each of the fin layout patterns of the set of fin layout patterns being separated from an adjacent fin layout pattern of the set of fin layout patterns in the second direction by a fin pitch.

3. The method of claim 1, wherein generating the layout design further comprises:
   generating a set of active region layout patterns extending in the first direction, being below the set of gate layout patterns and being separated from one another in the second direction, the set of active region layout patterns corresponding to fabricating a set of active regions of the integrated circuit.

4. The method of claim 1, wherein manufacturing the integrated circuit based on the layout design comprises:
   manufacturing a set of masks based on the layout design; and
   manufacturing the integrated circuit based on the set of masks.

5. The method of claim 1, wherein the set of gate layout patterns comprises:
   a first set of gate layout patterns corresponding to fabricating a set of functional gate structures of the integrated circuit; and
   a second set of gate layout patterns corresponding to fabricating a set of non-functional gate structures of the integrated circuit.

6. The method of claim 5, wherein
   a layout pattern of the first set of gate layout patterns is aligned in the second direction with a corresponding layout pattern of the second set of gate layout patterns.

7. The method of claim 6, wherein a gridline of the set of gridlines is aligned with a center of the layout pattern of the first set of gate layout patterns and a center of the corresponding layout pattern of the second set of gate layout patterns.

8. The method of claim 5, wherein generating the layout design further comprises:
   generating a set of conductive feature layout patterns extending in the second direction, each layout pattern of the set of conductive feature layout patterns being separated from one another in the first direction, the set of conductive feature layout patterns corresponding to fabricating a set of conductive structures of the integrated circuit.

9. The method of claim 8, wherein a layout pattern of the set of conductive feature layout patterns is between:
   a layout pattern of the first set of gate layout patterns and an adjacent layout pattern of the first set of gate layout patterns, or
   a layout pattern of the second set of gate layout patterns and an adjacent layout pattern of the second set of gate layout patterns.

10. The method of claim 1, wherein removing of the first portion of the gate structure comprises:
   performing an etch process on the first portion of the gate structure of the set of gate structures.

11. The method of claim 1, wherein
   the first portion of the gate structure comprises:
     a cut length in the first direction, and
     a cut width in the second direction; and
   the cut feature layout pattern comprises:
     a pattern length in the first direction, the pattern length corresponding to the cut length; and
     a pattern width in the second direction, the pattern width corresponding to the cut width.

12. A method of fabricating an integrated circuit, the method comprising:
   generating, by a processor, a layout design of the integrated circuit, wherein generating of the layout design comprises:
     placing a first set of gate layout patterns on a first layout level, the first set of gate layout patterns corresponding to fabricating a first set of gate structures of the integrated circuit, each of the layout patterns of the first set of gate layout patterns being separated from an adjacent layout pattern of the first set of gate layout patterns in a first direction by a first distance, the first set of gate layout patterns extending in a second direction different from the first direction and overlapping a first set of gridlines, the first set of gridlines extending in the second direction, and each gridline of the first set of gridlines being separated from an adjacent gridline of the first set of gridlines by a first pitch; and
     placing a second set of gate layout patterns on the first layout level, the second set of gate layout patterns corresponding to fabricating a second set of gate structures of the integrated circuit, each of the layout patterns of the second set of gate layout patterns being separated from an adjacent layout pattern of the second set of gate layout patterns in the first direction by a second distance, the second set of gate layout patterns extending in the second direction and overlapping a second set of gridlines, the second set of gridlines extending in the second direction, and each gridline of the second set of gridlines being separated from an adjacent gridline of the second set of gridlines by a second pitch; and
   manufacturing the integrated circuit based on the layout design, the integrated circuit having the first set of gate structures and the second set of gate structures.

13. The method of claim 12, wherein the second set of gate layout patterns includes 10 or more gate layout patterns.

14. The method of claim 12, wherein the first set of gate layout patterns alternate with the second set of gate layout patterns in the first direction.

15. The method of claim 12, wherein
   a layout pattern of the first set of gate layout patterns is aligned in the first direction with a corresponding layout pattern of the second set of gate layout patterns.

16. The method of claim 12, wherein
   the first distance is equal to the second distance; and
   the first pitch is equal to the second pitch.

17. The method of claim 12, wherein
   a layout pattern of the first set of gate layout patterns is adjacent to a layout pattern of the second set of gate layout patterns, and is separated from the layout pattern of the second set of gate layout patterns in the first direction by the first distance or the second distance.

18. A method of forming an integrated circuit, the method comprising:
   generating a first set of gate layout patterns corresponding to fabricating a set of functional gates of the integrated circuit, each of the layout patterns of the first set of gate layout patterns being separated from an adjacent layout pattern of the first set of gate layout patterns in a first direction by a first pitch, the first set of gate layout patterns extending in a second direction different from the first direction and overlapping a set of gridlines, the set of gridlines extending in the second direction, and each gridline of the set of gridlines being separated from an adjacent gridline of the set of gridlines by the first pitch;
   generating a second set of gate layout patterns corresponding to fabricating a set of non-functional gates of the integrated circuit, each of the layout patterns of the second set of gate layout patterns being separated from an adjacent layout pattern of the second set of gate layout patterns in the first direction by a second pitch, the second set of gate layout patterns extending in the second direction and overlapping the set of gridlines;
   placing a cut feature layout pattern over at least a portion of the first set of gate layout patterns or the second set of gate layout patterns, the cut feature layout pattern extending in the first direction; and
   manufacturing the integrated circuit based on at least the first set of gate layout patterns and the second set of gate layout patterns, the integrated circuit having at least a gate of the functional set of gates and a gate of the non-functional set of gates.

19. The method of claim 18, wherein manufacturing the integrated circuit comprises:
   removing at least a portion of the gate of the functional set of gates or a portion of the gate of the non-functional set of gates,
   wherein the cut feature layout pattern identifies a location of the removed portion of the gate of the functional set of gates or the removed portion of the gate of the non-functional set of gates.

20. The method of claim 18, further comprising:
   placing a first set of active region layout patterns below the first set of gate layout patterns, the first set of active region layout patterns extending in the first direction and corresponding to fabricating a first set of active regions of the integrated circuit; and
   placing a second set of active region layout patterns below the second set of gate layout patterns, the second set of active region layout patterns extending in the first direction and being separated from the first set of active region layout patterns in the second direction, and the second set of active region layout patterns corresponding to fabricating a second set of active regions of the integrated circuit.

* * * * *